United States Patent
El Baraji et al.

(10) Patent No.: US 10,229,724 B1
(45) Date of Patent: Mar. 12, 2019

(54) MICROWAVE WRITE-ASSIST IN SERIES-INTERCONNECTED ORTHOGONAL STT-MRAM DEVICES

(71) Applicant: Spin Memory, Inc., Fremont, CA (US)

(72) Inventors: Mourad El Baraji, Fremont, CA (US); Kadriye Deniz Bozdag, Sunnyvale, CA (US); Marcin Jan Gajek, Berkeley, CA (US); Michail Tzoufras, Sunnyvale, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/859,517

(22) Filed: Dec. 30, 2017

(51) Int. Cl.
| | |
|---|---|
| *G11C 11/16* | (2006.01) |
| *H01L 43/08* | (2006.01) |
| *H01L 27/22* | (2006.01) |
| *H01F 10/32* | (2006.01) |
| *H01L 43/02* | (2006.01) |

(52) U.S. Cl.
CPC ........ *G11C 11/1675* (2013.01); *G11C 11/161* (2013.01); *H01F 10/329* (2013.01); *H01F 10/3254* (2013.01); *H01F 10/3286* (2013.01); *H01L 27/222* (2013.01); *H01L 43/02* (2013.01); *H01L 43/08* (2013.01); *G11C 11/1673* (2013.01)

(58) Field of Classification Search
None
See application file for complete search history.

(56) References Cited

U.S. PATENT DOCUMENTS

| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |

(Continued)

FOREIGN PATENT DOCUMENTS

| CA | 2766141 A1 | 1/2011 |
| CN | 101036195 A | 9/2008 |

(Continued)

OTHER PUBLICATIONS

R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).

(Continued)

*Primary Examiner* — Douglas King
(74) *Attorney, Agent, or Firm* — Arnold & Porter Kaye Scholer LLP

(57) ABSTRACT

Methods and structures useful for magnetoresistive random-access memory (MRAM) are disclosed. The MRAM device has a magnetic tunnel junction stack having a significantly improved performance of the free layer in the magnetic tunnel junction structure. The MRAM device also utilizes a plurality of orthogonal spin transfer magnetic tunnel junction (OST-MTJ) stacks connected in series, with each OST-MTJ stack capable of selective activation by application of an external magnetic field, thereby allowing efficient writing of the bit without a concomitant increase in read disturb.

41 Claims, 12 Drawing Sheets

(56) References Cited

U.S. PATENT DOCUMENTS

| | | |
|---|---|---|
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama et al. |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,025,368 B2 | 5/2015 | Saida et al. |
| 9,082,888 B2 | 7/2015 | Kent et al. |
| 9,117,995 B2 | 8/2015 | Daibou et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 3/2016 | Pinarbasi et al. |
| 9,362,486 B2 | 6/2016 | Kim et al. |
| 9,379,314 B2 | 6/2016 | Park |
| 9,406,876 B2 | 8/2016 | Pinarbasi |
| 9,472,748 B2 | 10/2016 | Kuo et al. |
| 9,484,527 B2 | 11/2016 | Han et al. |
| 9,548,445 B2 | 1/2017 | Lee et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1* | 7/2004 | Durlam ............ G11C 11/15 365/158 |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |

(56) References Cited

U.S. PATENT DOCUMENTS

| | | |
|---|---|---|
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1* | 3/2007 | Panchula ............... B82Y 25/00 365/158 |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1* | 6/2011 | Apalkov ............... G01R 33/098 365/171 |
| 2011/0149632 A1* | 6/2011 | Chen .................. G11C 11/1659 365/130 |
| 2011/0216436 A1 | 9/2011 | Igarashi |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1 | 4/2014 | Sahoo et al. |
| 2014/0103472 A1 | 4/2014 | Kent et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1 | 12/2015 | Kent et al. |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1* | 12/2016 | Pinarbasi ............... H01L 43/08 |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0324029 A1 | 11/2017 | Pinarbasi et al. |
| 2017/0331032 A1 | 11/2017 | Chen et al. |
| 2017/0331033 A1 | 11/2017 | Kardasz et al. |
| 2017/0346002 A1 | 11/2017 | Pinarbasi et al. |
| 2018/0047894 A1 | 2/2018 | Pinarbasi et al. |
| 2018/0076382 A1 | 3/2018 | Park et al. |
| 2018/0114898 A1 | 4/2018 | Lee |

FOREIGN PATENT DOCUMENTS

| | | |
|---|---|---|
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-524830 A | 7/2008 |
| JP | 2009-027177 A | 2/2009 |
| JP | 2013-012546 A | 1/2013 |
| JP | 2014-039061 A | 2/2014 |

(56) References Cited

FOREIGN PATENT DOCUMENTS

| | | |
|---|---|---|
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 A | 9/2014 |
| KR | 10-2015-0016162 A | 2/2015 |
| WO | WO 2009-080636 A1 | 7/2009 |
| WO | WO 2011-005484 A2 | 1/2011 |
| WO | WO 2014-062681 A1 | 4/2014 |
| WO | WO-2015-153142 A1 | 10/2015 |
| WO | 2016011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |

OTHER PUBLICATIONS

K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Thermally Induced Magnetic Switching in Thin Ferromagnetic Annuli"; NSF grants PHY-0351964 (DLS); 2005; 11 pages.
Kirsten Martens, et al., "Magnetic Reversal in Nanoscopic Ferromagnetic Rings"; NSF grants PHY-0351964 (DLS); 2006; 23 pages.
"Magnetic Technology Sprintronics, Media and Interface"; Data Storage Institute, R&D Highlights; Sep. 2010; 3 pages.
S. Ikeda, et al.; "A perpendicular-anisotropy CoFeB—MgO magnetic tunnel junction"; Nature Materials, vol. 9, Sep. 2010; pp. 721-724; 4 pages.
Soo-Man Seo, et al.; "Current-induced synchronized switching of magnetization;" Applied Physics Letters 101; 2012 American Institute of Physics; Aug. 7, 2012; 6 pages.
Kent, et al.; U.S. Appl. No. 61/715,111, filed Oct. 17, 2012, entitled "Inverted Orthogonal Spin Transfer Layer Stack".
Pinarbasi, et al.; U.S. Appl. No. 14/341,185, filed Jul. 25, 2014, entitled "Method for Manufacturing MTJ Memory Device".
Pinarbasi, et al.; U.S. Appl. No. 14/492,943, filed Sep. 22, 2014, entitled "Magnetic Tunnel Junction Structure for MRAM Device".
International Search Report and Written Opinion dated Jul. 10, 2015 in PCT/US2015/021580; 12 pages.
Pinarbasi, et al.; U.S. Appl. No. 14/814,036, filed Jul. 30, 2015, entitled "Precessional Spin Current Structure for MRAM".
Kardasz, et al.; U.S. Appl. No. 14/866,359, filed Sep. 25, 2015, entitled "Spin Transfer Torque Structure for MRAM Devices Having a Spin Current Injection Capping Layer".
International Search Report and Written Opinion dated Oct. 30, 2015 in PCT/US2015/040700; 11 pages.
International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".
Kardasz, et al.; U.S. Appl. No. 15/091,853, filed Apr. 6, 2016, entitled "High Annealing Temperature Perpendicular Magnetic Anisotropy Structure for Magnetic Random Access Memory".
Pinarbasi, et al.; U.S. Appl. No. 15/093,367, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
International Search Report and Written Opinion dated Apr. 7, 2017 in PCT/US2016/067444; 13 pages.
Notice of Allowance dated Apr. 21, 2017 in U.S. Appl. No. 15/157,783; 36 pages.
Pinarbasi, et al.; U.S. Appl. No. 15/656,398, filed Jul. 21, 2017, entitled "Memory Cell Having Magnetic Tunnel Junction and Thermal Stability Enhancement Layer".
Kardasz, et al.; U.S. Appl. No. 15/657,498, filed Jul. 24, 2017, entitled "Spin Transfer Torque Structure for MRAM Devices Having a Spin Current Injection Capping Layer".
Notice of Allowance dated Jul. 27, 2017 in U.S. Appl. No. 15/097,576; 22 pages.
Pinarbasi, et al.; U.S. Appl. No. 15/674,620, filed Aug. 11, 2017, entitled "Polishing Stop Layer(s) for Processing Arrays of Semiconductor Elements".
Schabes, et al.; U.S. Appl. No. 15/634,629, filed Jun. 27, 2017, entitled "MRAM with Reduced Stray Magnetic Fields".
Notice of Allowance dated Oct. 16, 2017 in U.S. Appl. No. 14/814,036; 16 pages.
Pinarbasi, et al.; U.S. Appl. No. 15/794,871, filed Oct. 26, 2017, entitled "Precessional Spin Current Structure for MRAM".
Tzoufras, et al.; U.S. Appl. No. 15/858,950, filed Dec. 29, 2017, entitled "AC Current Pre-Charge Write-Assist in Orthogonal STT-MRAM".
Gajek, et al.; U.S. Appl. No. 15/858,988, filed Dec. 29, 2017, entitled "Self-Generating AC Current Assist in Orthogonal STT MRAM".
Ryan, et al.; U.S. Appl. No. 15/859,015, filed Dec. 29, 2017, entitled "Shared Oscillator (STNO) for MRAM Array Write-Assist in Orthogonal STT-MRAM".
Tzoufras, et al.; U.S. Appl. No. 15/859,030, filed Dec. 29, 2017, entitled "AC Current Write-Assist in Orthogonal STT-MRAM".
Bozdag, et al.; U.S. Appl. No. 15/859,047, filed Dec. 29, 2017, entitled "Three-Terminal MRAM with AC Write-Assist for Low Read Disturb".
Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Schabes, et al.; U.S. Appl. No. 15/859,384, filed Dec. 30, 2017, entitled "Perpendicular Magnetic Tunnel Junction Device with Skyrmionic Assist Layers for Free Layer Switching".
Schabes, et al.; U.S. Appl. No. 15/859,381, filed Dec. 30, 2017, entitled "Perpendicular Magnetic Tunnel Junction Device with Precessional Spin Current Layer Having a Modulated Moment Density".
Schabes, et al.; U.S. Appl. No. 15/859,379, filed Dec. 30, 2017, entitled "Perpendicular Magnetic Tunnel Junction Device with Offset Precessional Spin Current Layer".
Schabes, et al.; U.S. Appl. No. 15/859,374, filed Dec. 30, 2017, entitled "Switching and Stability Control for Perpendicular Magnetic Tunnel Junction Device".
El Baraji, et al.; U.S. Appl. No. 15/859,514, filed Dec. 30, 2017, entitled "Microwave Write-Assist in Orthogonal STT-MRAM".
International Search Report and Written Opinion dated May 10, 2018 in PCT/US2018/014645; 14 pages.

(56) References Cited

OTHER PUBLICATIONS

International Search Report and Written Opinion dated May 30, 2018 in PCT/US2018/014641; 13 pages.

* cited by examiner

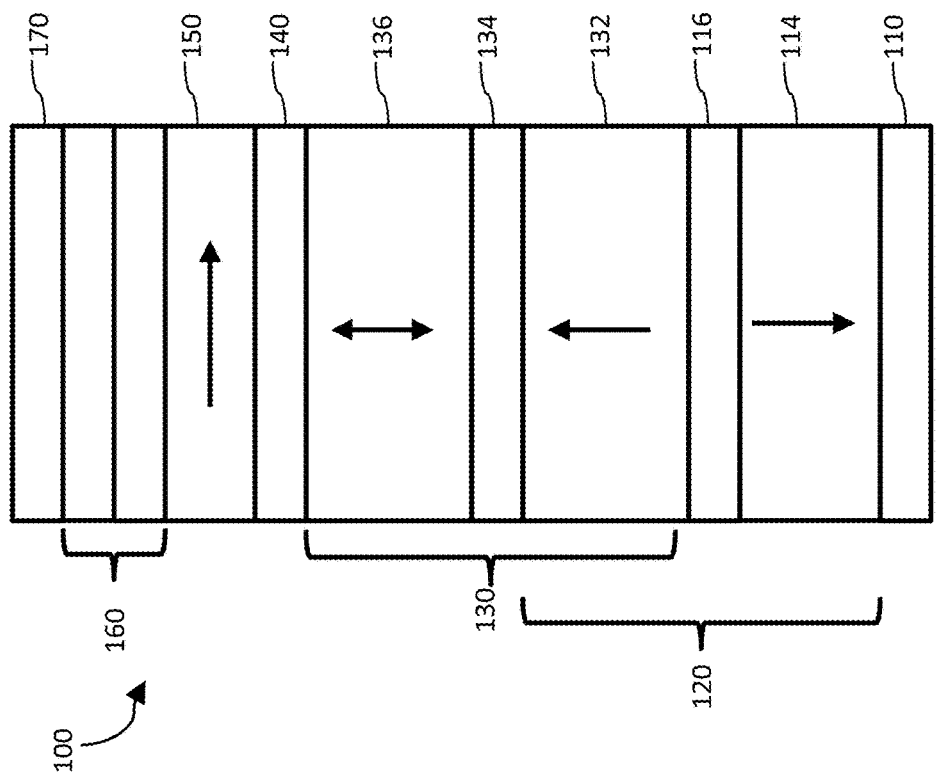

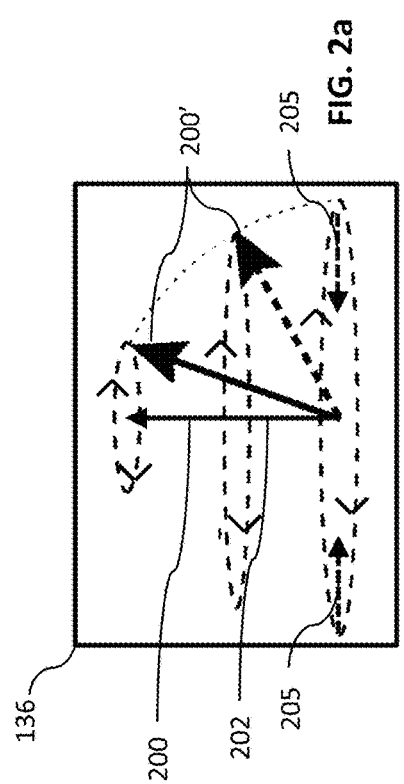
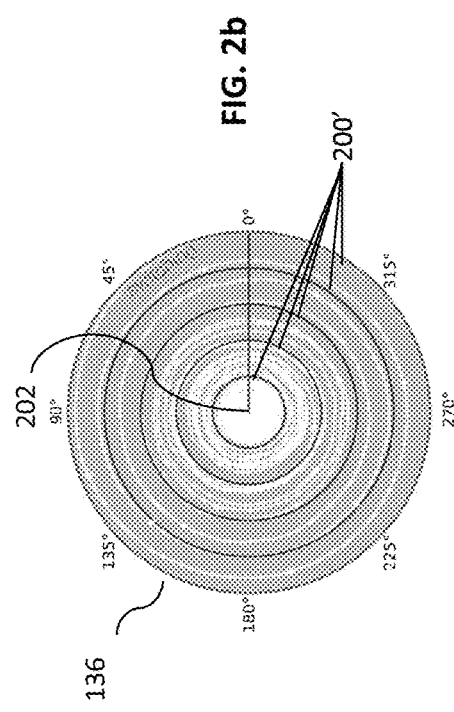

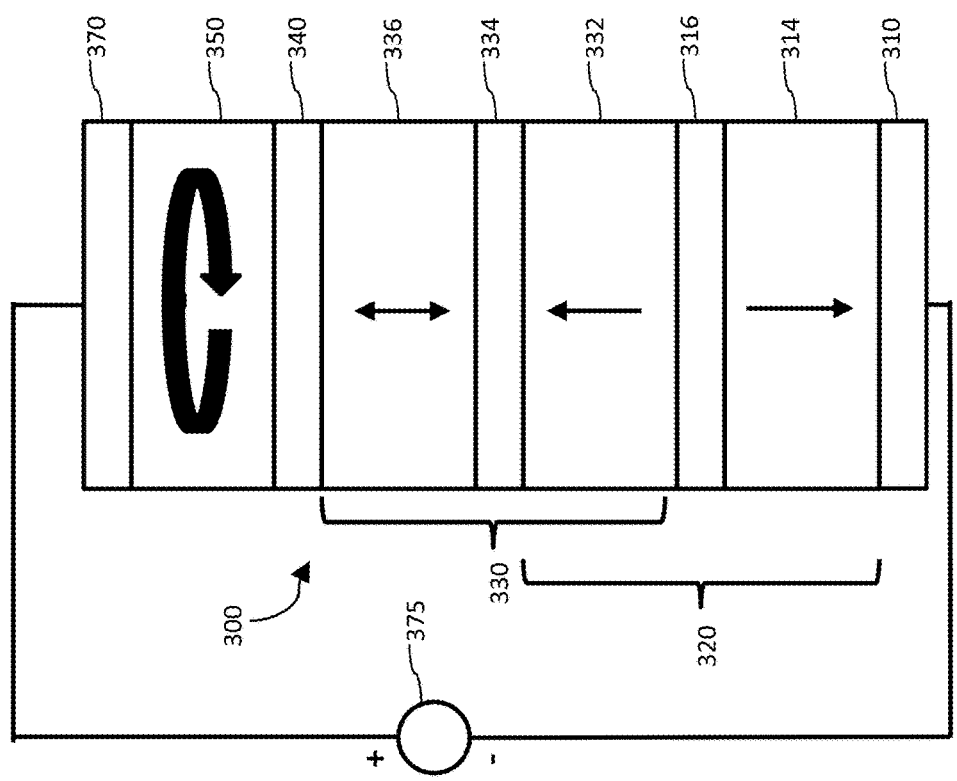

MICROWAVE WRITE-ASSIST IN SERIES-INTERCONNECTED ORTHOGONAL STT-MRAM DEVICES

FIELD

The present patent document relates generally to spin-transfer torque magnetic random access memory and, more particularly, to a magnetic tunnel junction stack having improved performance of the free layer in the magnetic tunnel junction structure.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer(s) and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction ("MTJ"). In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

When a current is passed through a magnetic layer (e.g., a polarizer), the spin orientation of the electrons that flow out of the magnetic layer is generally aligned in the direction of the magnetization of the magnetic layer and will exert a spin-transfer torque in that direction (forming a transverse spin current) upon impinging on another magnetic layer. However, due to the conservation of angular moment for the system, the electrons on the opposite side of magnetic layer, those that do not go through the magnetic layer, generally have a spin orientation that is aligned in the direction that is anti-parallel to the magnetization direction of the magnetic layer. The net effect of this process is that the current applied to the magnetic layer undergoes spin filtering, which creates a spin current on one side of the magnetic layer, with spins that are aligned with magnetization direction of the magnetic layer, and a reflected spin current on the other side of the magnetic layer, with spins that are anti-parallel to the magnetization direction of the magnetic layer. This effect occurs upon application of a current to any magnetic layer, including an in-plane polarization layer or an out-of-plane reference magnetic layer. Thus, in a typical MTJ, when switching the magnetization direction of the free layer in one direction (e.g., from the parallel to anti-parallel state) is achieved using spin transfer torque from the transverse spin current, switching the free layer in the other direction (e.g., from the anti-parallel to parallel states) would be achieved using spin transfer torque from the reflected spin current. This is typically accomplished by running electrical current through the MTJ in one direction when switching from the anti-parallel to parallel state and running the electrical current through the MTJ in the other direction when switching from the parallel to anti-parallel state.

FIG. 1 illustrates a MTJ stack 100 for an MRAM device including a magnetic tunnel junction MTJ 130 and a top polarizer layer 150. As shown, stack 100 includes one or more seed layers 110 provided at the bottom of stack 100 to initiate a desired crystalline growth in the above-deposited layers. Furthermore, MTJ 130 is deposited on top of Synthetic Anti-Ferromagnetic (SAF) layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has an antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Polarizer 150 polarizes the current in a direction perpendicular (orthogonal) to those of the magnetizations of the free magnetic layer 136 and reference magnetic layer 132. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a combination of reactive ion etch (RIE) and ion beam etching (IBE) processes.

Various mechanisms have been proposed to assist the free-layer magnetization switching in MTJ devices. One issue has been that to realize the orthogonal spin transfer effect for in-plane MTJ structures, large spin currents may be required for switching. The need for large switching currents may limit such device's commercial applicability. One way proposed to reduce switching current is to lower the magnetization of the free layer. However, if the effective magnetization of the free layer is lowered significantly, the orthogonal effect has to be limited so that the free-layer does not go into precessional mode that would make the end state of the free-layer magnetization un-deterministic. This defines the operation window for the in-plane OST structures. In an in-plane device, unlike that shown in FIG. 1, the magnetization direction of the reference layer and free layer are in the plane of the layer. Another aspect of in-plane devices is that the thermal stability requirements may limit the size of the MTJ devices to approximately sixty nanometers or higher.

In contrast to MTJ structures with an in-plane free layer and perpendicular polarizer perpendicular MTJ structures such as those shown in FIG. 1, are less prone to getting into a pure precessional regime. This is due to the fact that in perpendicular MTJ structures, the direction of the demagnetization field and perpendicular anisotropy contributions are the same. In this case the precession is generally not an issue and the end-state is more deterministic. However, precession may be an issue with regards to read disturb, particularly when stronger read currents are used. The orthogonal polarizer acts on the free layer magnetization at the initial state, but when the precession takes hold, the fixed orthogonal polarizer 150 helps only half the cycle of the free-layer magnetization rotation while it harms the other half of the cycle. This is demonstrated with reference to FIGS. 2-3. FIG. 2a-2b shows switching of a free layer 136 of an MTJ. As is seen, free layer 136 has a magnetization direction 200 perpendicular to that of the polarizer 150. The magnetization direction 200 of the free layer 136 can rotate by 180 degrees. FIGS. 2a-2b show precession about the axis of the magnetization vector of free layer 136. During precession, magnetic vector 200 begins to rotate about its axis in a cone-like manner such that its magnetization vector 200' deflects from the perpendicular axis 202 of free layer 136. Whereas prior to initiating precession, no component of magnetic vector 200 is in the plane of free layer 136, once precession starts, a component of magnetic vector 200' can be found both in-plane and orthogonal to free layer 136. As magnetic vector 200' continues to precess (i.e., switch), the rotation of vector 200' extends further from the center of free layer 136, as is seen in FIG. 2b.

In most prior MTJ devices using a polarizer such as polarizer 150, the magnetization direction of polarizer 150 is fixed, which is shown in FIGS. 1 and 3. See also U.S. Pat. No. 6,532,164, which states that the direction of the magnetization of the polarizing layer cannot vary in the presence of current. Prior to current passing through the MTJ, the free layer 136 has a magnetization direction 200 perpendicular to that of the polarizer 150. While the magnetization direction 200 of the free layer 136 can rotate by 180 degrees, such rotation is normally precluded by the free layer's inherent damping ability 205, which is represented by a vector 205 pointing to axis 202 (shown as a dashed line in FIG. 2a as well as FIG. 3). Axis 202 is perpendicular to the plane of free layer 136. This damping 205 has value, defined by the damping constant, which maintains the magnetization direction of the free layer 136.

The precession of the magnetization vector during switching of the free layer can be assisted by spin transfer torque exerted by the electrons of a spin-polarized current, which is generated in part by the orthogonal polarizer 150. Applying a voltage across the MTJ device 100 produces a charge current through the device. This charge current, in turn, produces a spin-polarized current via spin filtering through the magnetic layers of the device (i.e., the orthogonal polarizer 150 and the reference layer 132). The spin-polarized electrons of the spin-polarized current exerts a spin transfer torque on the magnetic vector 200. This spin transfer torque has an in-plane component of the spin transfer torque 210, which pushes magnetization vector 200' in the direction of the magnetic vector of polarizer 150 throughout precession of magnetic vector 200'. In addition to the in-plane spin transfer torque 210 from the polarizer, the perpendicular spin transfer torque (not shown), generated by reference layer 132, pulls the magnetic vector 200' towards the direction antiparallel to its initial direction 200, thereby causing switching of the free layer 136. In devices like those shown in FIG. 1, when the spin transfer torque 210 begins to help overcome the damping 205 inherent to the free layer 136, the magnetic direction 200' begins to precess about its axis, as shown in FIG. 2a. As seen in FIG. 3, in-plane spin transfer torque 210 helps the magnetization direction of the free layer 136 to precess in a cone-like manner around an axis 202 perpendicular to the plane of the layers. When a spin polarized current traverses the stack 100, the magnetization of the free layer 136 precesses in a continuous manner (i.e., it turns on itself in a continuous manner as shown in FIG. 3) with maintained oscillations until the magnetic direction of free layer 136 is opposite the magnetic direction prior to the spin torque causing precession, i.e., the magnetic direction of free layer 136 switches by 180 degrees.

FIG. 3 illustrates precession of a free layer 136 of an MTJ assisted by orthogonal spin polarized current. The spin polarized electrons from polarizer 150 provide a spin transfer torque which has a component 210 in the plane of the precession (i.e., in-plane spin transfer torque) that helps overcome the damping 205 in the first half of the precession 215 because the in-plane spin transfer torque 210 provided by the spin polarized current is opposite that of the inherent damping 205 of the free layer 136. This is shown on the right-hand side of the middle portion of FIG. 3, which illustrates the projection of spin transfer torque 210 onto the precession plane (i.e., the plane defined by axis 200 and magnetization vector 200' as it steadily precesses around axis 200). However, the in-plane spin transfer torque actually harms the switching process during the second half of the precession 220. The reason for this is that the spin of the electrons in the spin polarized current only apply an in-plane spin transfer torque 210 in the direction of their polarization, which is aligned with the magnetic direction of the in-plane polarization layer 150. Thus, when the magnetic vector is in the half of the precession cycle 220 that is opposite the spin of the polarized electrons, the in-plane spin transfer torque 210 actually works with the inherent damping 205 of free layer 136 to make rotation more difficult. This is shown in the left-hand side of the middle portion of FIG. 3 and can be seen in the projection of the spin transfer torque 210 onto the precessional plane of the free layer 136, which is depicted on the bottom of FIG. 3. Indeed, it is the perpendicular spin transfer torque created by the reference layer 132 (not shown in FIG. 3) that overcomes the damping 205 of free layer 136 as well as the in-plane spin transfer torque 210 during the half of a precession cycle where the spin of the electrons harms precession, and thus it is the reference layer 132 that allows for completion of precession. The precessional dynamics and the directionality of the spin transfer torque depicted in FIG. 3 are merely approximations at small magnetization polar angles and do not necessarily reflect the phenomena occurring at larger magnetization polar angles. However the precessional dynamics that occur when the magnetization vector of the free layer 132 is at small magnetization polar angles are, to a large extent, determinative of the efficiency of the switching process.

One solution that has been proposed to overcome this limitation is the use of a precessional spin current ("PSC") magnetic layer having a magnetization vector that can freely rotate in any magnetic direction, shown in FIG. 4a-b. The free layer 336 is similar to the free layer 136 previously discussed, in that it has an inherent damping characteristic 205 that can be overcome with the assistance of spin transfer torque. However, the polarizing layer 150 is replaced with a precessional magnetic layer 350. As seen in FIG. 4a, which shows the projection onto the precessional plane of the direction of the spin transfer torque 410 created by spin current passing through free layer 336, the direction of spin transfer torque 410 changes with the rotation of PSC magnetic layer 350. As seen on the right side of FIG. 4a, spin transfer torque 410 causes the magnetization direction 200' of the free layer 336 to precess in a cone-like manner around an axis 202 perpendicular to the plane of the layers. The PSC layer 350 and the free-layer 336 are magnetically and/or electronically coupled such that the magnetization direction of the magnetization vector 270 of the PSC magnetic layer 350 follows the precessional rotation of the magnetic vector of the free layer 336. Thus, at all times, the magnetization vector of the PSC layer 350 follows the precessional motion of the magnetization vector of the free layer 336. This is true whether the free layer is being switched from the parallel state to the antiparallel state or from the antiparallel state to the parallel state.

As seen in on the right-hand side of FIG. 4a, the spin polarized electrons provide torque 410 that helps to overcome the damping 205 in the first half of the precession 215 because the torque 410 provided by the spin polarized current is opposite that of the inherent damping 205 of the free layer 336. In addition, torque 410 helps to overcome the damping 205 in the second half of the precession 220 by the same mechanism. Thus, unlike prior devices having a fixed polarization magnetic layer 150, the spin of the electrons in the spin polarized current applies a torque 410 in both halves of the precession cycle, including the half of the precession cycle 220 where devices with fixed polarization magnetic layers 150 actually harmed precession. As is seen, the torque 410 continues to help overcome the inherent damping 205 of free layer 136 throughout the entire precession cycle. An MRAM device utilizing an MTJ structure with a PSC is depicted in FIG. 5.

However, because of the chirality of perpendicular MTJ structures that utilize a PSC, such as the structure shown in FIG. 5, the PSC only enhances switching of the free layer in one direction (i.e., from the parallel state to the anti-parallel state, FIG. 4a), but not the other (i.e., from the antiparallel state to the parallel state, FIG. 4b). As discussed above, when switching the free layer 336 from the first direction to the second direction, the spin current is generated by the electrons passing through the PSC layer and the in-plane spin transfer torque 410 is in line with the magnetic vector of the PSC layer (FIG. 4a). However, during switching free layer 336 from the second direction to the first direction, it is the reflected spin current from PSC layer that imparts the in-plane spin transfer torque 411 on the free layer 336. As shown in FIG. 4b, the in-plane spin transfer torque 411 caused by the reflected spin current is in the direction anti-parallel to the magnetic vector 270 of the PSC layer 350. When the magnetic vector 270 is aligned with the magnetic vector 200, the in-plane spin transfer torque 411 might actually enhance the damping characteristic 205 of the free layer 336. Therefore, when the precession of magnetic vector 270 of the PSC layer 350 is synchronized with the precession of the magnetic vector 200 of the free layer 336, the in-plane spin transfer torque 411 might enhance the damping characteristic 205 throughout the entire precession 220'. Because the PSC layer 350 and the free layer 336 are magnetically and/or electronically coupled, the precession of magnetization vector 270 and magnetization vector 200 are synchronized during switching in both directions. Thus, the PSC layer can be highly effective at increasing the switching efficiency of the free layer in one direction, but may actually hamper switching in the other direction.

Thus, in prior devices that utilize in-plane polarization layers having a fixed magnetization direction and having a free magnetic layer 150 that is perpendicular to the plane of the device, once the precession holds, the in-plane spin transfer torque has no net positive effect on the switching mechanism for a full three hundred sixty degree precession. Moreover, in prior devices that utilize a PSC magnetic layer 350, the in-plane spin transfer torque enhances the switching of the free layer 336 throughout the precession from the first direction to the second direction, but might not enhance the switching of the free layer 336 from the second direction to the first direction. This is due at least in part to the magnetic and/or electronic coupling between the PSC layer 350 and free layer 336.

Therefore, there is a need for a spin torque transfer device that reduces the amount of current needed for switching from both magnetization directions while also switching at high speeds and requiring reduced chip area.

SUMMARY

An MRAM device is disclosed that has a magnetic tunnel junction stack having a significantly improved performance of the free layer in the magnetic tunnel junction structure that requires significantly lower switching currents and which significantly reduces switching times for MRAM applications and maintains this characteristic for both switching directions (AP to P and P to AP)

In one embodiment, a magnetic device includes a plurality of orthogonal spin transfer magnetic tunnel junction (OST-MTJ) stacks comprising a first OST-MTJ stack and a second OST-MTJ stack. The plurality of OST-MTJ stacks is connected in series by a conductive wire. The first OST-MTJ stack and the second OST-MTJ stack each include a magnetic tunnel junction (MTJ) in a first plane. The MTJ comprises a reference magnetic layer, a non-magnetic tunnel barrier layer, and a free magnetic layer. The free magnetic layer and the reference magnetic layer are separated by the non-magnetic tunnel barrier layer. The reference magnetic layer has a magnetization vector that is perpendicular to the first plane and has a fixed magnetization direction. The free magnetic layer has a magnetization vector that is perpendicular to the first plane and has a magnetization direction that can switch from a first magnetization direction to a second magnetization direction and from the second magnetization direction to the first magnetization direction. The switching process involves precessions at a precession radius around an axis perpendicular to the first plane, and the magnetization vector of the free magnetic layer has a predetermined precession frequency. The first OST-MTJ stack and the second OST-MTJ stack each also include (b) a non-magnetic spacer in a second plane. The non-magnetic spacer separates the MTJ from an inducible precessional magnetic layer. The first OST-MTJ stack and the second OST-MTJ stack each also include (c) the inducible precessional magnetic layer in a third plane and coupled to the non-magnetic spacer. The inducible precessional magnetic layer has a magnetization vector with a magnetization component in the third plane that rotates at an induced rotation frequency upon interaction with an alternating magnetic field. The magnetization vector of the inducible precessional magnetic layer is fixed in the absence of the alternating magnetic field. The magnetic device also includes (2) a programming current source that directs a programming current through the plurality of OST-MTJ stacks via the conductive wire. The magnetic device also includes (3) a plurality of external magnetic field generators. The plurality of external magnetic field generators comprises a first external magnetic field generator and a second external magnetic field generator. The first external magnetic field generator and the second external magnetic field generator each comprise an external wire and an AC current source. The AC current source directs an alternating current through the external wire, thereby generating an alternating magnetic field. The first external magnetic field generator can generate a first alternating magnetic field that interacts with the magnetization vector of the inducible precessional magnetic layer of the first OST-MTJ stack. The second external magnetic field generator can generate a second alternating magnetic field that interacts with the magnetization vector of the inducible precessional magnetic layer of the second OST-MTJ stack. Application of the programming current to the plurality of OST-MTJ stacks produces a first spin-polarized current having spin-polarized electrons in the first OST-MTJ stack. The first spin-polarized electrons exerts a first spin transfer torque on the magnetization vector of the free magnetic layer of the first OST-MTJ stack. The direction of the first spin transfer torque is determined by the direction of the magnetization vector of the inducible precessional magnetic layer of the first OST-MTJ stack. The induced rotation frequency of the inducible precessional magnetic layer of the first OST-MTJ stack is synchronized with the predetermined precession frequency of the free magnetic layer of the first OST-MTJ stack when the first alternating magnetic field interacts with the magnetization vector of the inducible precessional magnetic layer of the first OST-MTJ stack, thereby causing the first spin transfer torque to assist switching of the magnetization vector of the free magnetic layer of the first OST-MTJ stack.

In another embodiment, the inducible precessional magnetic layer has a weak or nonexistent in-plane uniaxial anisotropy and preferably a low moment.

In another embodiment, the plurality of OST-MTJ stacks further includes a third OST-MTJ stack. The third OST-MTJ stack includes a magnetic tunnel junction (MTJ) in a first plane. The MTJ comprises a reference magnetic layer, a non-magnetic tunnel barrier layer, and a free magnetic layer. The free magnetic layer and the reference magnetic layer are separated by the non-magnetic tunnel barrier layer. The reference magnetic layer has a magnetization vector that is perpendicular to the first plane and has a fixed magnetization direction. The free magnetic layer has a magnetization vector that is perpendicular to the first plane and has a magnetization direction that can switch from a first magnetization direction to a second magnetization direction and from the second magnetization direction to the first magnetization direction. The switching process involves precessions of the magnetization vector around an axis perpendicular to the first plane at a precession radius. The third OST-MTJ stack also includes (b) a non-magnetic spacer in a second plane. The non-magnetic spacer separates the MTJ from an inducible precessional magnetic layer. The third OST-MTJ stack also includes (c) the inducible precessional magnetic layer in a third plane and coupled to the non-magnetic spacer. The inducible precessional magnetic layer has a magnetization vector with a magnetization component in the third plane that rotates at an induced rotation frequency upon interaction with an alternating magnetic field. The magnetization vector of the inducible precessional magnetic layer is fixed in the absence of the alternating magnetic field.

In another embodiment, the plurality of external magnetic field generators further includes a third external magnetic field generator. The third external magnetic field generator comprises an external wire and an AC current source. The AC current source directs an alternating current through the external wire, thereby generating an alternating magnetic field. The third external magnetic field generator can generate a third alternating magnetic field that interacts with the magnetization vector of the inducible precessional magnetic layer of the third OST-MTJ stack.

In another embodiment, application of the programming current to the plurality of OST-MTJ stacks produces a second spin-polarized current having spin-polarized electrons in the second OST-MTJ stack. The second spin-polarized electrons exert a second spin transfer torque on the magnetization vector of the free magnetic layer of the second OST-MTJ stack. The direction of the second spin transfer torque is determined in part by the direction of the magnetization vector of the inducible precessional magnetic layer of the first OST-MTJ stack. The induced rotation frequency of the inducible precessional magnetic layer of the second OST-MTJ stack is synchronized with the predetermined precession frequency of the free magnetic layer of the second OST-MTJ stack when the second alternating magnetic field interacts with the magnetization vector of the inducible precessional magnetic layer of the second OST-MTJ stack, thereby causing the second spin transfer torque to assist switching of the magnetization vector of the free magnetic layer of the second OST-MTJ stack.

In another embodiment, the induced rotation frequency of the inducible precessional magnetic layer of the first OST-MTJ stack has a first frequency value and the induced rotation frequency of the inducible precessional magnetic layer of the second OST-MTJ stack has a second frequency value.

In another embodiment, the first frequency value is equal to the second frequency value.

In another embodiment, the first frequency value is different than the second frequency value.

In another embodiment, the difference between the first frequency value and the second frequency value is less than forty percent of the second frequency value.

In another embodiment, the difference between the first frequency value and the second frequency value is less than thirty percent of the second frequency value.

In another embodiment, the difference between the first frequency value and the second frequency value is less than twenty percent of the second frequency value.

In another embodiment, the predetermined precession frequency of the free magnetic layer of the first OST-MTJ stack is the same frequency as the predetermined precession frequency of the magnetic layer of the second OST-MTJ stack.

In another embodiment, the predetermined precession frequency of the free magnetic layer of the first OST-MTJ stack is a different frequency than the predetermined precession frequency of the magnetic layer of the second OST-MTJ stack.

In another embodiment, a difference in frequency between the induced rotation frequency of the inducible precessional magnetic layer of the first OST-MTJ stack and the predetermined precession frequency of the free magnetic layer of the first OST-MTJ stack is less than twenty percent of the predetermined precession frequency of the free magnetic layer of the first OST-MTJ stack.

In another embodiment, a difference in frequency between the induced rotation frequency of the inducible precessional magnetic layer of the first OST-MTJ stack and the predetermined precession frequency of the free magnetic layer of the first OST-MTJ stack is less than ten percent of the predetermined precession frequency of the free magnetic layer of the first OST-MTJ stack.

In another embodiment, a difference in frequency between the induced rotation frequency of the inducible precessional magnetic layer of the first OST-MTJ stack and the predetermined precession frequency of the free magnetic layer of the first OST-MTJ stack is less than five percent of the predetermined precession frequency of the free magnetic layer of the first OST-MTJ stack.

The magnetic device of claim 1, a difference in frequency between the induced rotation frequency of the inducible precessional magnetic layer of the first OST-MTJ stack and the predetermined precession frequency of the free magnetic layer of the first OST-MTJ stack is less than two percent of the predetermined precession frequency of the free magnetic layer of the first OST-MTJ stack.

In another embodiment, the first alternating magnetic field exerts a force on the magnetization vector of the free magnetic layer of the first OST-MTJ stack, thereby assisting in the switching of the magnetization direction of the free magnetic layer.

In another embodiment, the first alternating magnetic field enhances the precession of the magnetization vector of the free magnetic layer of the first OST-MTJ stack.

In another embodiment, switching the magnetization direction of the free magnetic layer of the first OST-MTJ stack requires the magnetization vector of the inducible precessional magnetic layer of the first OST-MTJ stack to rotate at the induced rotation frequency.

In another embodiment, switching the magnetization direction of the free magnetic layer of the first OST-MTJ stack requires generating the first alternating magnetic field.

In another embodiment, switching the magnetization direction of the free magnetic layer of the second OST-MTJ stack requires generating the second alternating magnetic field.

In another embodiment, the non-magnetic spacer of the first OST-MTJ stack prevents coupling of the free magnetic layer of the first OST-MTJ stack to the inducible precessional magnetic layer of the first OST-MTJ stack.

In another embodiment, the free magnetic layer of the first OST-MTJ stack comprises CoFeB, the non-magnetic tunnel barrier layer of the first OST-MTJ stack comprises MgO, and the free magnetic layer of the first OST-MTJ stack comprises CoFeB.

In another embodiment, the inducible precessional magnetic layer of the first OST-MTJ stack has a weak in-plane anisotropy.

In another embodiment, the inducible precessional magnetic layer of the first OST-MTJ stack comprises CoFeB.

In another embodiment, the non-magnetic spacer of the first OST-MTJ stack comprises MgO.

In another embodiment, a magnetic device includes a plurality of orthogonal spin transfer magnetic tunnel junction (OST-MTJ) stacks comprising a first OST-MTJ stack and a second OST-MTJ stack. The plurality of OST-MTJ stacks is connected in series by a conductive wire. The first OST-MTJ stack and the second OST-MTJ stack each include a magnetic tunnel junction (MTJ) in a first plane. The MTJ comprises a reference magnetic layer, a non-magnetic tunnel barrier layer, and a free magnetic layer. The free magnetic layer and the reference magnetic layer are separated by the non-magnetic tunnel barrier layer. The reference magnetic layer has a magnetization vector that is perpendicular to the first plane and has a fixed magnetization direction. The free magnetic layer has a magnetization vector that is perpendicular to the first plane and has a magnetization direction that can switch from a first magnetization direction to a second magnetization direction and from the second magnetization direction to the first magnetization direction. The switching process involves precessions at a precession radius around an axis perpendicular to the third plane, and the magnetization vector of the free magnetic layer has a predetermined precession frequency. The first OST-MTJ stack and the second OST-MTJ stack each also include (b) a non-magnetic spacer in a second plane. The non-magnetic spacer separates the MTJ from an inducible precessional magnetic layer. The first OST-MTJ stack and the second OST-MTJ stack each also include (c) the inducible precessional magnetic layer in a third plane and coupled to the non-magnetic spacer. The inducible precessional magnetic layer has a magnetization vector with a magnetization component in the third plane that rotates at an induced rotation frequency upon interaction with an alternating magnetic field. The magnetization vector of the inducible precessional magnetic layer is fixed in the absence of the alternating magnetic field. The magnetic device also includes (2) a programming current source that directs a programming current through the plurality of OST-MTJ stacks via the conductive wire. The magnetic device also includes (3) an external magnetic field generator. The external magnetic field generator comprises an external wire and an AC current source. The AC current source directs alternating current through the external wire, thereby generating one or more alternating magnetic fields. The external magnetic field generator can generate a first alternating magnetic field that alternates at a first frequency and a second alternating magnetic field that alternates a second frequency. The first alternating magnetic field interacts with the magnetization vector of the inducible precessional magnetic layer of the first OST-MTJ stack, thereby causing the magnetization vector of the inducible precessional magnetic layer of the first OST-MTJ stack to rotate at a first induced rotation frequency. Application of the programming current to the plurality of OST-MTJ stacks produces a first spin-polarized current having spin-polarized electrons in the first OST-MTJ stack. The spin-polarized electrons exert a first spin transfer torque on the magnetization vector of the free magnetic layer of the first OST-MTJ stack. The direction of the first spin transfer torque is determined in part by the direction of the magnetization vector of the inducible precessional magnetic layer of the first OST-MTJ stack. The first induced rotation frequency is synchronized with the predetermined precession frequency of the free magnetic layer of the first OST-MTJ stack when the first alternating magnetic field interacts with the magnetization vector of the inducible precessional magnetic layer of the first OST-MTJ stack, thereby causing the first spin transfer torque to assist switching of the magnetization vector of the free magnetic layer of the first OST-MTJ stack.

In another embodiment, the second alternating magnetic field interacts with the magnetization vector of the inducible precessional magnetic layer of the second OST-MTJ stack, thereby causing the magnetization vector of the inducible precessional magnetic layer of the second OST-MTJ stack to rotate at a first induced rotation frequency. Application of the programming current to the plurality of OST-MTJ stacks produces a second spin-polarized current having spin-polarized electrons in the second OST-MTJ stack. The spin-polarized electrons exert a second spin transfer torque on the magnetization vector of the free magnetic layer of the second OST-MTJ stack. The direction of the first spin transfer torque is determined in part by the direction of the magnetization vector of the inducible precessional magnetic layer of the first OST-MTJ stack. The second induced rotation frequency is synchronized with the predetermined precession frequency of the free magnetic layer of the second OST-MTJ stack when the second alternating magnetic field interacts with the magnetization vector of the inducible precessional magnetic layer of the second OST-MTJ stack, thereby causing the second spin transfer torque to assist switching of the magnetization vector of the free magnetic layer of the second OST-MTJ stack.

In another embodiment, the first frequency is different than the second frequency and the magnetization vector of the inducible precessional magnetic layer of the second OST-MTJ stack is fixed in the presence of the first alternating magnetic field.

In another embodiment, the first frequency is different than the second frequency and the magnetization vector of the inducible precessional magnetic layer of the first OST-MTJ stack is fixed in the presence of the second alternating magnetic field.

In another embodiment, a difference between the first frequency and the second frequency is less than forty percent of the first frequency.

In another embodiment, a difference between the first frequency and the second frequency is less than thirty percent of the first frequency.

In another embodiment, a difference between the first frequency and the second frequency is less than twenty percent of the first frequency.

In another embodiment, a difference between the first frequency and the second frequency is less than ten percent of the first frequency.

In another embodiment, the first induced rotation frequency is different than the second induced rotation frequency and the magnetization vector of the inducible precessional magnetic layer of the second OST-MTJ stack is fixed in the presence of the first alternating magnetic field.

In another embodiment, the first induced rotation frequency is different than the second induced rotation frequency and the magnetization vector of the inducible precessional magnetic layer of the first OST-MTJ stack is fixed in the presence of the second alternating magnetic field.

In another embodiment, the predetermined precession frequency of the free magnetic layer of the first OST-MTJ stack is different than the predetermined precession frequency of the free magnetic layer of the second OST-MTJ stack.

In another embodiment, a difference between the predetermined precession frequency of the free magnetic layer of the first OST-MTJ stack and the predetermined precession frequency of the free magnetic layer of the second OST-MTJ stack is less than forty percent of the predetermined precession frequency of the free magnetic layer of the first OST-MTJ stack.

In another embodiment, a difference between the predetermined precession frequency of the free magnetic layer of the first OST-MTJ stack and the predetermined precession frequency of the free magnetic layer of the second OST-MTJ stack is less than twenty percent of the predetermined precession frequency of the free magnetic layer of the first OST-MTJ stack.

In another embodiment, a difference between the predetermined precession frequency of the free magnetic layer of the first OST-MTJ stack and the predetermined precession frequency of the free magnetic layer of the second OST-MTJ stack is less than twenty percent of the predetermined precession frequency of the free magnetic layer of the first OST-MTJ stack.

In another embodiment, the external magnetic field generator can generate a third alternating magnetic field that alternates at a third frequency. The third alternating magnetic field interacts with the magnetization vector of the inducible precessional magnetic layer of the third OST-MTJ stack, thereby causing the magnetization vector of the inducible precessional magnetic layer of the third OST-MTJ stack to rotate at a third induced rotation frequency. Application of the programming current to the plurality of OST-MTJ stacks produces a third spin-polarized current having spin-polarized electrons in the third OST-MTJ stack. The spin-polarized electrons exert a third spin transfer torque on the magnetization vector of the free magnetic layer of the third OST-MTJ stack. The direction of the first spin transfer torque is determined in part by the direction of the magnetization vector of the inducible precessional magnetic layer of the third OST-MTJ stack. The third induced rotation frequency is synchronized with the predetermined precession frequency of the free magnetic layer of the third OST-MTJ stack when the third alternating magnetic field interacts with the magnetization vector of the inducible precessional magnetic layer of the third OST-MTJ stack, thereby causing the third spin transfer torque to assist switching of the magnetization vector of the free magnetic layer of the third OST-MTJ stack.

In another embodiment, the first induced rotation frequency is different than the third induced rotation frequency and the magnetization vector of the inducible precessional magnetic layer of the first OST-MTJ stack is fixed in the presence of the third alternating magnetic field.

In another embodiment, switching the magnetization direction of the free magnetic layer of the first OST-MTJ stack requires generating the first alternating magnetic field.

In another embodiment, switching the magnetization direction of the free magnetic layer of the second OST-MTJ stack requires generating the second alternating magnetic field.

In another embodiment, switching the magnetization direction of the free magnetic layer of the third OST-MTJ stack requires generating the third alternating magnetic field.

In another embodiment, an external uniform magnetic field is used to set the direction of precession of the inducible precessional magnetic layer.

In another embodiment the fringing fields from the reference layer are used to set the direction of rotation of the inducible precessional magnetic layer.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 1 illustrates a conventional perpendicular MTJ stack with an in-plane polarizer for an MRAM device.

FIGS. 2*a*-2*b* illustrates the precession of the free layer in an MTJ.

FIG. 5 illustrates an MTJ stack for an MRAM device having a precessional spin current magnetic layer.

Figure 3:
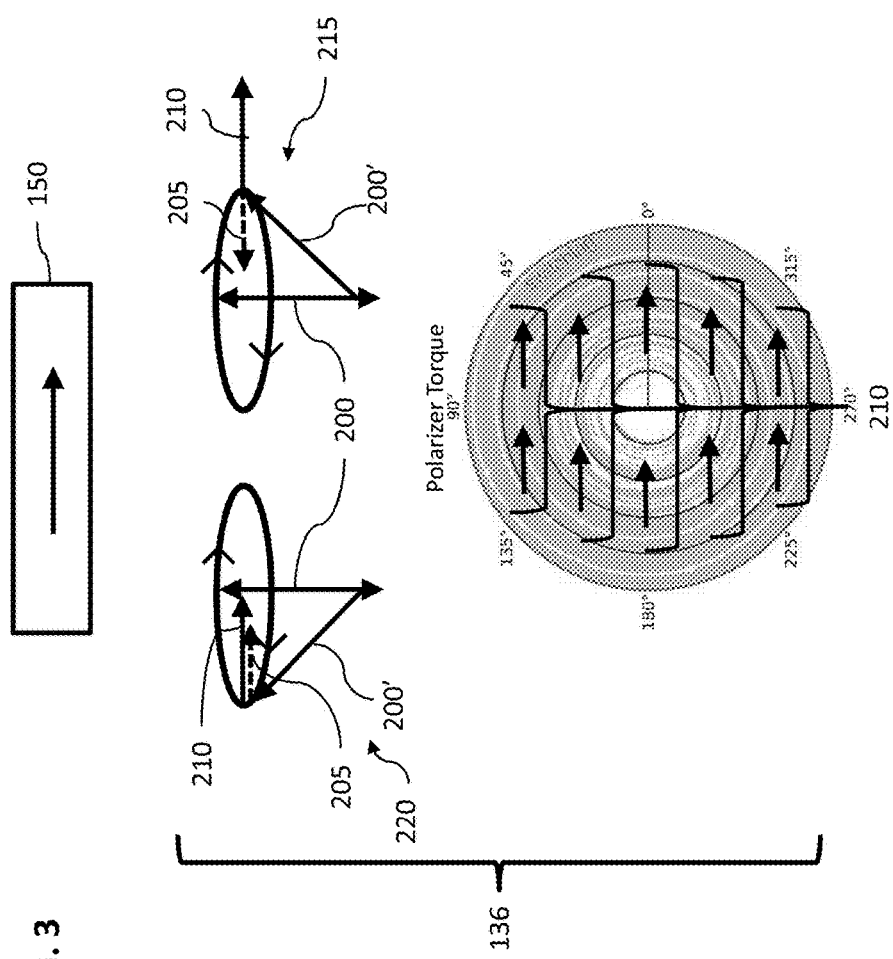
FIG. 3 illustrates the precession of the free layer in an MTJ used with a polarizing magnetic layer having a fixed magnetization direction.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use methods and magnetic devices that utilize a plurality of orthogonal spin transfer magnetic tunnel junction (OST-MTJ) stacks connected in series, each having an inducible precessional magnetic layer that can be activated in the presence of a resonant alternating magnetic field. These methods and devices can be used to assist in the switching of a magnetization vector for a magnetic semiconductor device such as an MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

The present patent document discloses a MRAM device that comprises a plurality of orthogonal spin transfer magnetic tunnel junction (OST-MTJ) stacks and a plurality of external magnetic field generators. This device is described with reference to FIGS. 6-10. The plurality of OST-MTJ stacks are connected in series via a conductive wire. The plurality of OST-MTJ stacks and the plurality of magnetic field generators are physically separated and are arranged in sets. Each set contains one OST-MTJ stack and one magnetic field generator that are proximate to each other such that the magnetic field created by the magnetic field generator can interact with its corresponding OST-MTJ stack in the set. Each OST-MTJ stack has an inducible precessional magnetic layer (i.e., inducible polarizer) that has a magnetization vector that precesses upon exposure to an external alternating magnetic field. Each external magnetic field generator comprises a first current source and an external wire. When writing a bit, an OST-MTJ stack is selected and the corresponding magnetic field generator creates an alternating magnetic field that interacts with the selected OST-MTJ. The alternating magnetic field is generated, for example, when the first current source of the selected magnetic field generator applies an electrical current comprising an alternating current to its corresponding external wire, thereby generating an alternating magnetic field. The alternating magnetic field induces precession or rotation of the magnetization vector of the inducible polarizer in the selected OST-MTJ stack. The magnetization vector precesses or rotates at an induced rotation frequency. A second current source directs a programming current pulse through the plurality of OST-MTJ stacks during the writing process. Application of this programming current pulse to the selected OST-MTJ stack creates a spin-polarized current having spin polarized electrons. The spin-polarized electrons exert a spin transfer torque on the magnetization vector of the free magnetic layer of the selected OST-MTJ stack. The direction of the spin transfer torque is determined in part by the magnetization vector of the inducible polarizer of the selected OST-MTJ stack. In some embodiments, the induced rotation frequency is synchronized with the predetermined precession frequency of magnetization vector of the free layer of the selected OST-MTJ stack, thereby causing spin transfer torque to assist switching of the magnetization vector of the free layer of the selected OST-MTJ stack.

The present patent document also discloses a MRAM device that comprises a plurality of orthogonal spin transfer magnetic tunnel junction (OST-MTJ) stacks and a single external magnetic field generator. This device is described with reference to FIGS. 8-10. The plurality of OST-MTJ stacks are connected in series via a conductive wire. The plurality of OST-MTJ stacks and the magnetic field generator are physically separated; however, the magnetic field generator is proximate to the plurality of OST-MTJ stacks such that the magnetic field created by the magnetic field generator can interact with all OST-MTJ stack in the plurality of OST-MTJ stacks. Each OST-MTJ stack has an inducible precessional magnetic layer (i.e., inducible polarizer) that has a magnetization vector that precesses or rotates upon exposure to an external alternating magnetic field. In one embodiment, the magnetization vector of the inducible polarizer in each OST-MTJ stack precesses or rotates at a unique induced rotation frequency such that no two OST-MTJ stacks in the plurality share the same induced rotation frequency. In one embodiment, the induced rotation frequencies can be set, for example, by changing the dimensions and compositions of the various layers within the OST-MTJ stack. The external magnetic field generator comprises a first current source and an external wire. The external magnetic field generator can create different alternating magnetic fields that oscillate at different field frequencies. When writing a bit, an OST-MTJ stack is selected and the magnetic field generator creates an alternating magnetic field that oscillates at a field frequency that is resonant with the magnetization vector of the inducible polarizer of the selected OST-MTJ stack. The alternating magnetic field is generated when the first current source of the selected magnetic field generator applies an electrical current comprising an alternating current to its corresponding external wire, thereby generating an alternating magnetic field. The frequency of the alternating current is selected such that the magnetic field generator creates an alternating magnetic field with an oscillating frequency that is resonant with the inducible polarizer of the selected OST-MTJ stack. The alternating magnetic field induces precession or rotation of the magnetization vector of the inducible polarizer in the selected OST-MTJ stack. The magnetization vector of the inducible polarizer precesses or rotates at its unique induced rotation frequency. In some embodiments, the alternating magnetic field does not induce precession or rotation of the inducible polarizer of any OST-MTJ stack other than the selected OST-MTJ stack. A second current source directs a programming current pulse through the plurality of OST-MTJ stacks during the writing process. Application of this programming current pulse to the selected OST-MTJ stack creates a spin-polarized current having spin polarized electrons. The spin-polarized electrons exert a spin transfer torque on the magnetization vector of the free magnetic layer of the selected OST-MTJ stack. The direction of the spin transfer torque is determined in part by the magnetization vector of the inducible polarizer of the selected OST-MTJ stack. In some embodiments, the induced rotation frequency is synchronized with the predetermined precession frequency of magnetization vector of the free layer of the selected OST-MTJ stack, thereby causing spin transfer torque to assist switching of the magnetization vector of the free layer of the selected OST-MTJ stack.

The present patent document also discloses a method for switching the magnetization vector of a free layer in a magnetic device that comprises a plurality of orthogonal spin transfer magnetic tunnel junction (OST-MTJ) stacks connected in series and one or more external magnetic field generators. This method comprises first activating a selected OST-MTJ stack for writing by generating an external alternating magnetic field that selectively induces precession or rotation of the inducible polarizer of the selected OST-MTJ stack. The external alternating magnetic field continues to be generated for a first time frame. Second, an electrical current (i.e., a programming current pulse) is applied to the plurality of OST-MTJ stacks. Application of this programming current pulse to the selected OST-MTJ stack generates a spin-polarized current having spin polarized electrons. Third, the spin-polarized current having spin-polarized electrons is injected into the free magnetic layer. The spin-polarized electrons exert a spin transfer torque on the magnetization vector of the free magnetic layer a direction that is determined in part by the direction of the magnetization vector of the inducible polarizer. In some embodiments, the induced rotation frequency of the inducible polarizer is synchronized with the predetermined precession frequency of magnetization vector of the free layer, thereby causing spin transfer torque to assist switching of the magnetization vector of the free layer. Fourth, the injection of the spin-polarized electrons into the free layer is maintained for a second time interval. Fifth, the magnetization vector of the free layer is switched from a first magnetization direction to a second magnetization direction or from a second magnetization direction to a first magnetization direction. In some embodiments, the first time interval and second time interval overlap such that the alternating magnetic field is generated for a least part of the time that the programming current is applied to the OST-MTJ stack. This method could be used, for example, with any of the structural embodiments disclosed herein.

As described above, when a programming current pulse is applied to the PSC layer 350 and a perpendicular MTJ 330, a spin-polarized current having spin-polarized electrons is formed. Also as described above, when switching the magnetization vector of the free layer 336 from the parallel direction to the antiparallel direction, the spin-polarized electrons exert an in-plane spin transfer torque on the magnetization vector of the free layer 336 that is in the direction of the magnetization vector of the PSC layer 350. However, when switching free layer 336 from the antiparallel direction to the parallel direction, the spin-polarized electrons exert an in-plane spin transfer torque (generated by the reflected spin current from PSC layer 350) on the magnetization vector of free layer 336 that is antiparallel to the direction of the magnetization vector of the PSC layer 350. In devices such as MTJ stack 300, the PSC layer 350 is magnetically and/or electronically coupled with free layer 336 such that the rotation of the magnetization vector of PSC 350 follows the precession of free layer 336. Thus, the in-plane spin transfer torque generated by PSC layer 350 assists during switching from the parallel direction to antiparallel direction (i.e., when the in-plane spin transfer torque is generated from the transverse spin current) but can impede switching from the antiparallel direction to the parallel direction (i.e., when the in-plane spin transfer torque is generated from the reflected spin current).

The various embodiments described herein, such as magnetic device 700, benefit from the advantages of devices comprising PSC layers, but offer at least three additional significant improvements: (1) improved switching efficiency when switching the free layer 536 in both directions (i.e., from parallel to antiparallel and from parallel to antiparallel); (2) reduced probability of inadvertent free layer switching when reading the resistance across a selected OST-MTJ stack; and (3) increased memory density in MRAM devices that utilize the various embodiments disclosed herein. For purposes of simplicity of explanation, the concepts underlying these various advantages will be initially described with respect to a single OST-MTJ stack/magnetic field generator set, such as magnetic device 500 depicted in FIG. 7.

Upon application of an electrical current comprising an alternating current to external wire 580, an external alternating magnetic field is generated. The external alternating magnetic field induces the magnetization vector of inducible polarizer 550 to rotate around an axis perpendicular to the plane of the inducible polarizer layer (i.e., precess around a perpendicular axis). In some embodiments, the external alternating magnetic field causes the magnetization vector of inducible polarizer 550 to rotate in the plane. In some embodiments, the external alternating magnetic field also interacts with the magnetization vector of free layer 536, thereby assisting the precession of the magnetization vector of the free layer 536. An electrical current pulse (i.e., a programming current pulse) can then be applied to OST-MTJ stack 560. Application of the programming current to OST-MTJ stack 560 generates a spin current that exerts a spin transfer torque on the magnetization vector of free layer 536. The spin transfer torque comprises an in-plane spin transfer torque that exerts torque on the free layer in a direction that is determined in part by the magnetization vector of the inducible polarizer 550. In some embodiments, the alternating frequency of the external alternating magnetic field is set to a frequency value such that the external alternating magnetic field causes the magnetization vector of inducible polarizer 550 to precess at a frequency that is synchronized with the predetermined precession frequency of the magnetization vector of free layer 536. In such embodiments, the in-plane spin transfer torque will assist switching of the free layer in a manner similar to the switching enhancement offered by PSC layer 350, described above.

However, in contrast to magnetic device 300, the inducible polarizer 550 is not magnetically or electronically coupled to free layer 536; rather the precession of the inducible polarizer 550 is controlled in part by the external alternating magnetic field. Therefore, the magnetization vector of inducible polarizer 550 can rotate in such a manner as to apply an in-plane spin transfer torque that enhances the precession of free layer 536 even when the in-plane spin transfer torque is generated by the reflected spin current from inducible polarizer 550 (i.e., when switching free layer 536 from the antiparallel direction to the parallel direction).

Moreover, unlike magnetic device 300, where precession of the magnetization vector of PSC layer 350 is caused by application of an electrical current to MTJ stack 300, application of an electrical current to OST-MTJ stack 560 in magnetic device 500 does not cause precession of the magnetization vector of inducible polarizer 550. Precession of the magnetization vector of inducible polarizer 550 occurs when an alternating current is flowing through external wire 580, thereby generating the external alternating magnetic field. Thus, precession of the magnetization vector of inducible polarizer 550 is effectively decoupled from the programming current applied to OST-MTJ stack 560. In some embodiments, the magnetization vector of free layer 532 will not switch unless the magnetization vector of inducible polarizer 550 is precessing. In such embodiments, an electrical current can be applied to OST-MTJ stack 560 and the magnetization vector of inducible polarizer 550 will not precess unless the external alternating magnetic field has been generated. Therefore, the resistance across OST-MTJ stack 560 can be measured (i.e., the bit can be read) in the absence of the external alternating magnetic field and there will be an extremely low probability of inadvertently switching the free layer 536 (i.e., read disturb) when reading the bit in this manner. The various embodiments disclosed herein utilize a plurality of the OST-MTJ structures described above (e.g., magnetic device 700) and therefore, offer these advantages during the reading and writing processes. In addition, magnetic devices that use a plurality of OST-MTJ stacks offer additional advantages, including increased memory density, not available to memory bits that utilize only one OST-MTJ stack for each programming current source, such as magnetic device 500.

Figure 6A:
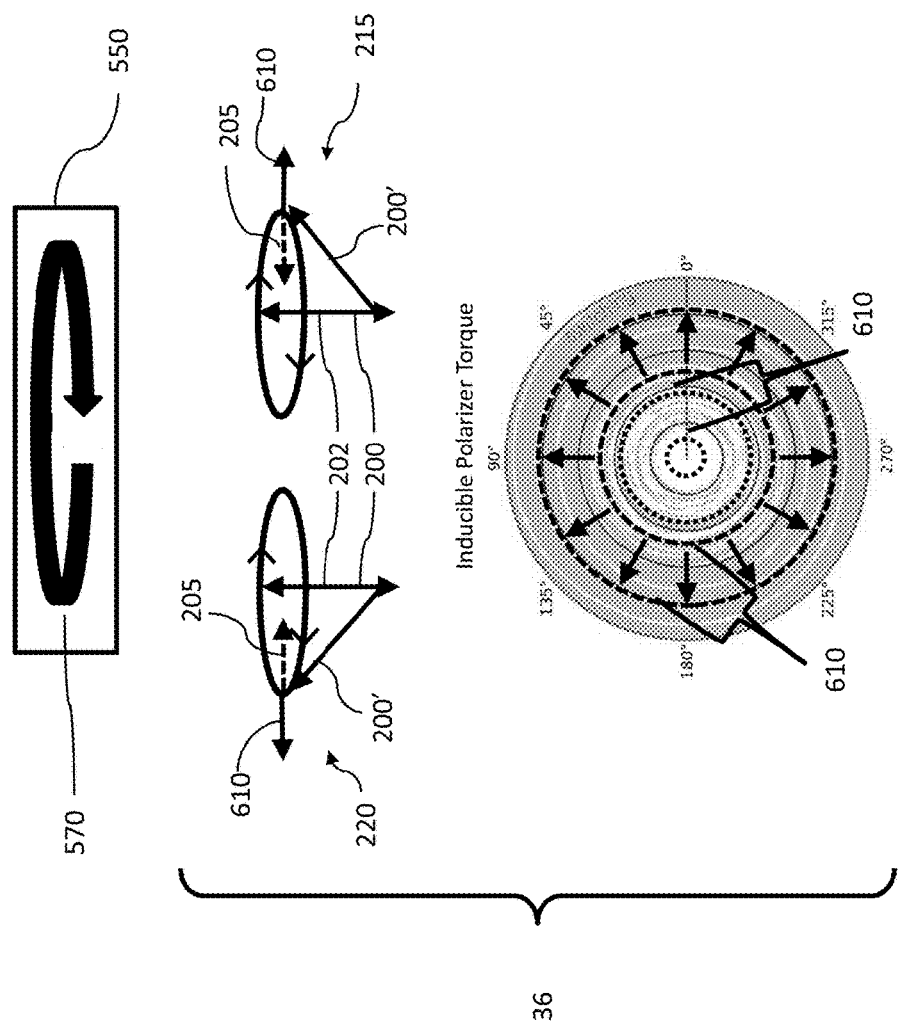
FIGS. 6*a*-6*b* illustrates the precession of the free layer in an MTJ with an in-plane polarizing magnetic layer with a magnetization vector that precesses upon exposure to an external alternating magnetic field (i.e., an inducible precessional magnetic layer)
Figure 6B:
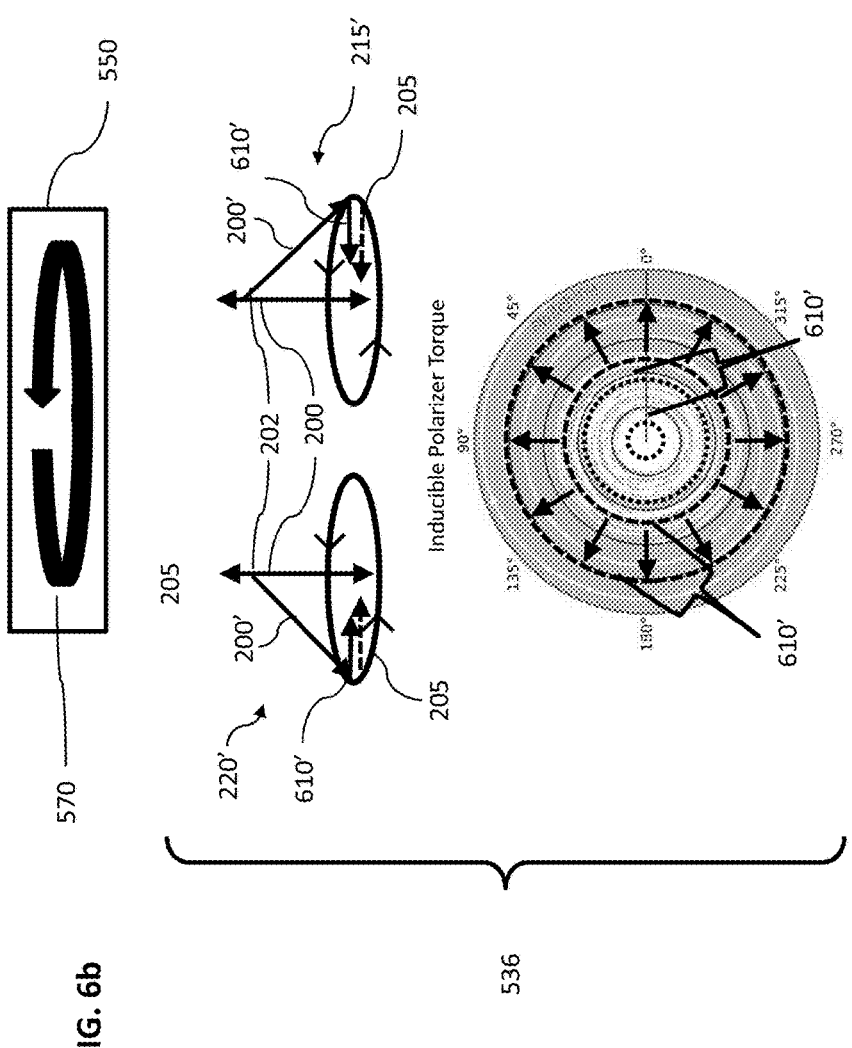

FIGS. 6a and 6b show the concepts behind the writing process of the various devices disclosed herein. For simplicity of explanation, these initial descriptions of the magnetization dynamics involved in free layer switching will be made with respect to magnetic device 500, which utilizes only a single OST-MTJ stack and a single external magnetic field generator. The magnetization dynamics depicted in FIGS. 6a and 6b are approximations of the dynamics that occur during the initial stages of switching the magnetization vector of free layer 536 (i.e., when the angle between axis 200 and magnetic vector 200' is small). At larger magnetization polar angles (i.e., about greater than 10 degrees from equilibrium), the dynamics presented in these figures are no longer valid approximations of the magnetization dynamics of the free layer. Nevertheless, the precessional dynamic that occur at low magnetization polar angles are to a great extent determinative of the switching process and are therefore useful in understanding the disclosures herein. Moreover, because the precessional dynamics at low magnetization polar angles are important to improved switching of the free layer, the frequency at which the inducible precessional magnetic layer rotates/precesses (i.e., the induced rotation frequency) are matched to the precession frequencies of the free layers at lower magnetization polar angles (i.e., the predetermined precession frequency).

Like the PSC layer 550 previously discussed, the inducible precessional magnetic layer 550 has a magnetic vector 570 with an in-plane component that can freely rotate (top of FIG. 6a). However, the magnetization vector 570 of inducible polarizer 550 rotates upon exposure to an external alternating magnetic field, not upon application of an electrical current to MTJ stack 560. This is in contrast to the magnetization vector 270 of the PSC layer 350, which rotates when an electrical current is applied to MTJ stack 300. Free layer 536 is similar to the free layer 136 previously discussed, in that it has an inherent damping characteristic 205 that can be overcome with the assistance of spin transfer torque. As seen in the middle of FIG. 6a, the in-plane spin transfer torque 610 causes the magnetization direction 200' of the free layer 536 to precess in a cone-like manner around an axis 202 perpendicular to the plane of the layers. FIG. 6a shows a progression of rotation of the magnetic direction 200' about axis 202. As discussed, when a spin polarized current traverses the device, the magnetization of the free layer 536 precesses in a continuous manner (i.e., it turns on itself in a continuous manner as shown in the middle of FIG. 6a) with maintained oscillations until the magnetic direction of free layer 536 is opposite the magnetic direction prior to the spin torque causing precession, i.e., the magnetic direction of free layer 536 switches by 180 degrees.

The spin-polarized electrons of the spin-polarized current exert a spin transfer torque on the magnetization vector 200 of the free layer 536. This spin transfer torque has both an in-plane spin torque component 610 and a perpendicular spin torque component (not shown in FIG. 6a). The perpendicular spin torque exerts a force on the magnetization vector of the free layer 536 that pulls the magnetization vector from one perpendicular position to the other perpendicular position (e.g., from the parallel to the anti-parallel state). This perpendicular spin torque component is caused by spin-polarization of the electrons by the reference magnetic layer 532 (depicted in FIG. 7). The in-plane spin torque 610 assists in the switching of the free layer by providing a force that pushes the magnetization vector 200' away from the perpendicular axis 202, allowing the perpendicular spin transfer torque to act on the magnetization vector 200', thereby switching the free layer 536. This in-plane spin torque 610 is caused by spin-polarization of the electrons by the inducible precessional magnetic layer 550.

As discussed above, the magnetization vector 570 of inducible precessional magnetic layer 550 precesses at an induced rotation frequency due to the application of an external alternating magnetic field to the inducible precessional magnetic layer 550. The induced rotation frequency is dependent on, inter alia, the dimensions and composition of inducible precessional magnetic layer 550 and the frequency at which the external alternating magnetic field oscillates between the first magnetic field direction and the second magnetic field direction. This magnetic field oscillating frequency is, in turn, dependent on the dimensions and composition of external wire 580 and the frequency of the alternating current that is directed through the external wire 580. Therefore, the induced rotation frequency can be set to match the predetermined precession frequency of the magnetization vector of the free magnetic layer 536.

When the induced rotation frequency of the inducible precessional magnetic layer 550 is matched to the predetermined precession frequency of the free magnetic layer 536, the in-plane spin transfer torque 610 generated by the inducible polarizer 550 enhances the precession of the free magnetic layer 536 throughout the entire 360 degree precession, as shown on the bottom of FIG. 6a. During switching of free layer 536 from the parallel direction to the antiparallel direction, the magnetization vector 570 of the inducible polarizer 550 precesses in the same direction as the precession of the magnetization vector 200' of free layer 536 (as depicted on the top of FIG. 6a). When magnetization vector 270 precesses in the same direction as magnetization vector 200' and the two precession frequencies are matched, the inducible polarizer 550 can be set to rotate such that magnetization vector 270 effectively follows the precession of magnetization vector 200' in a manner similar to that observed in magnetic device 300 utilizing PSC magnetic layer 350. In other words, the direction of the in-plane component of the magnetization vector 570 is parallel to the direction of the in-plane component of the magnetization vector 200' throughout the precession of magnetization vector 200'. In such embodiments, during switching the free layer 536 from the parallel direction to the antiparallel direction, the transverse spin current (generated by the application of the programming current across OST-MTJ stack 560) exerts an in-plane spin transfer torque that pushes magnetization vector towards the equator throughout the precession of the free layer. In this way, the inducible polarizer 550 enhances the efficiency of switching the free layer 536 during switching from the parallel direction to the antiparallel direction (i.e., from the first magnetization direction to the second magnetization direction).

Thus, in some respects, the external alternating magnetic field "activates" the OST-MTJ stack for switching that is achieved by application of the programming current to the activated OST-MTJ stack. Moreover, in some embodiments disclosed herein, each OST-MTJ stack in a plurality of OST-MTJ stacks can be designed to have a unique induced rotation frequency and a correspondingly matched predetermined precession frequency. The induced rotation frequency and predetermined precession frequencies can be set, at least in part, by the structure and composition of the various layers of the OST-MTJ stacks. Thus, each OST-MTJ stack will be activated for writing by alternating magnetic fields that oscillate at unique frequencies, such that one oscillating frequency can activate only one specific OST-MTJ stack in the plurality of OST-MTJ stacks. These unique frequencies are set in part by the structure and composition of the various layers of the OST-MTJ stack.

Figure 4A:
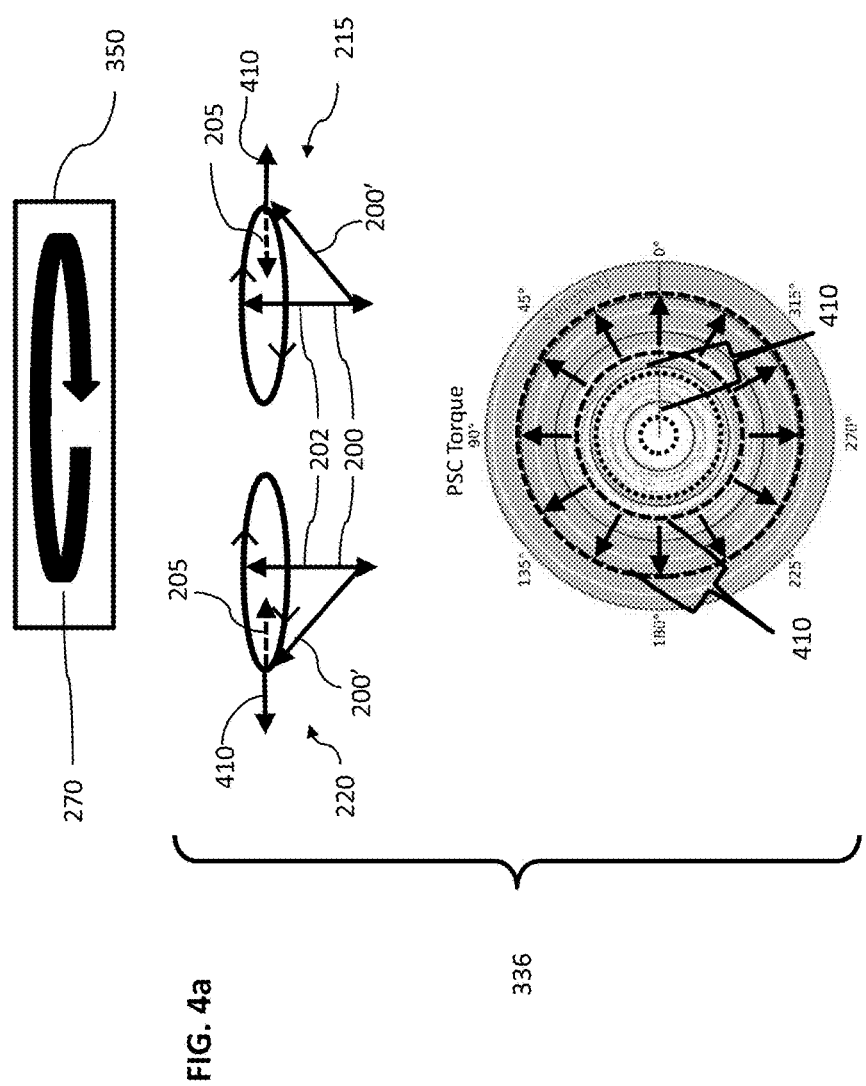
FIGS. 4*a*-*b* illustrates the precession of the free layer in an MTJ with a precessional spin current magnetic layer having a magnetization direction that rotates freely.
Figure 4B:
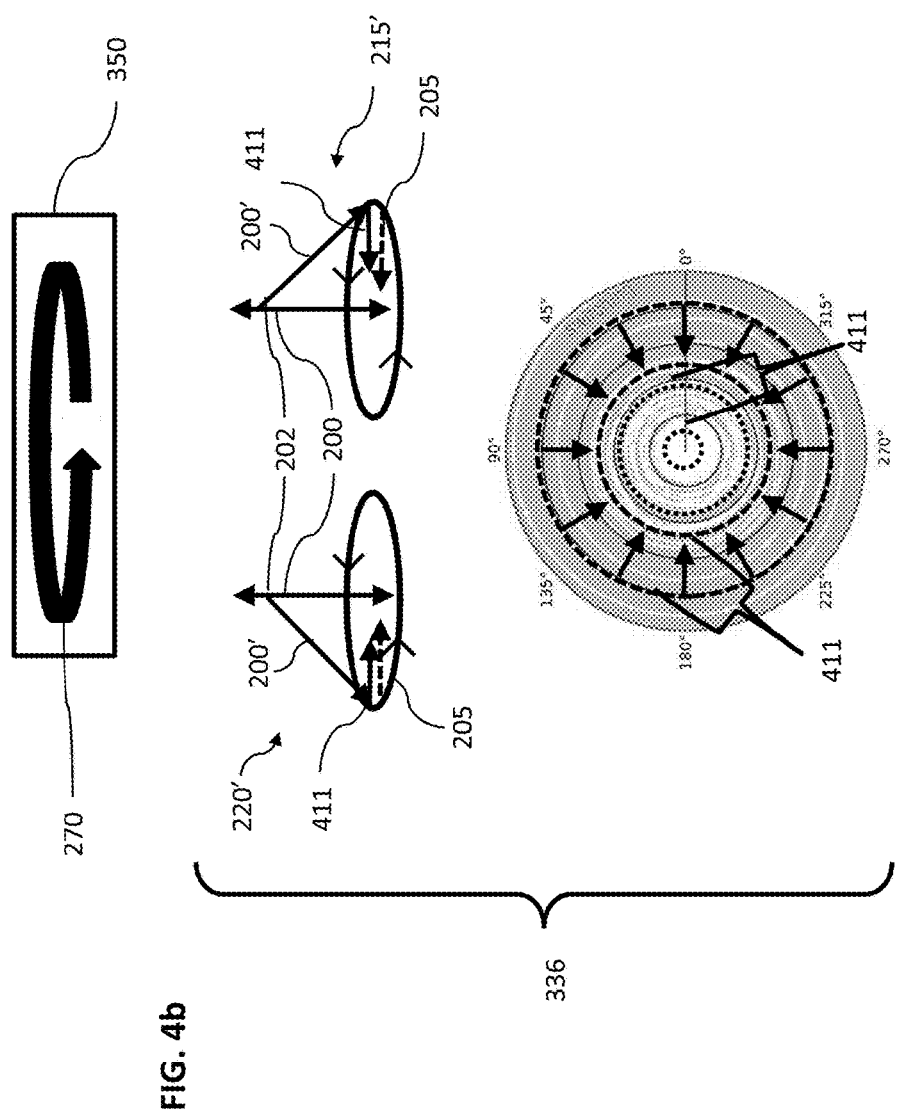

The magnetization dynamics during switching the free layer 536 from the antiparallel direction to the parallel direction, shown in FIG. 6b, are similar to, but distinctly different from, the magnetization dynamics depicted in FIG. 6a (i.e., those observed during switching of the free layer from the parallel direction to the antiparallel direction). As discussed above, the precessional dynamics of magnetization vector 570 are decoupled from the free layer 536 and are controlled in part by the external alternating magnetic field. Consequentially, the magnetization vector 570 of inducible polarizer 550 does not necessarily follow the precession of free layer 536. In some embodiments, the direction of the in-plane component of magnetization vector 570 is antiparallel to the direction of the in-plane component of magnetization vector 200' during switching free layer 536 from the second magnetization direction to the first magnetization direction (i.e., from the antiparallel direction to the parallel direction). As described above, during switching the free layer from the antiparallel direction, the in-plane spin transfer torque is generated by the reflected spin current from inducible polarizer 550. Also as described above, the direction of the in-plane spin transfer torque generated by this reflected spin current is antiparallel to the direction of magnetization vector 570. Thus, when the in-plane component of the magnetization vector 570 is antiparallel to the in-plane component of the magnetization vector 200', the in-plane spin transfer torque generated by the reflected spin current from inducible polarizer 550 is in the same direction as the in-plane component of magnetization vector 200'. In this way, the spin transfer torque generated by inducible polarizer 550 can enhance the precession of free layer 536, even when switching the free layer 536 from the antiparallel direction to the parallel direction. Moreover, when the induced rotation frequency of the inducible polarizer 550 is matched to the predetermined precession frequency of the free magnetic layer 536, the two magnetization vectors (i.e., magnetization vector 570 and magnetization vector 200') can maintain antiparallel orientation throughout their respective precessions. Thus, the inducible polarizer 550 can enhance the efficiency of switching the free layer during switching from the antiparallel direction to the parallel direction (i.e., from the second magnetization direction to the first magnetization direction). In some embodiments, the rotational direction of the inducible polarizer 550 is opposite from the precessional direction of the free magnetic layer 536, thereby avoiding potential enhancement of the damping characteristic 205 when switching from the antiparallel state to the parallel state (i.e., the precessional dynamic depicted in FIG. 4b).

The rotational direction of the inducible polarization magnetic layer 550 is preferably set externally, such that the rotation direction of the inducible polarizer 550 is decoupled from the precession direction of free layer 536. In some embodiments, the rotational direction of the inducible polarizer 550 is set by an external uniform magnetic field. In one embodiment, the rotational direction of the inducible polarizer 550 is set by the fringing fields from the magnetization vector of the reference magnetic layer 532.

Magnetic devices that utilize inducible polarizers, such as magnetic device 500, also possess the advantage of greatly reduced read disturb probabilities (i.e., the probability that the free layer will be switched when reading the bit). In the absence of the external alternating magnetic field, the magnetic vector of the inducible polarizer 550 does not rotate; rather the magnetization vector of the inducible polarizer 550 is fixed and its magnetization dynamics are similar to those depicted in FIG. 3 and described above. As a result, the in-plane spin transfer torque provides no net benefit for switching the free layer and writing the bit requires a significantly stronger programming current. Thus, the bit can be read in the absence of the external alternating magnetic field (i.e., with no alternating current running through external wire 580), with a significantly reduced read disturb probability. This advantage of reduced read disturb rates is particularly useful in the context of the magnetic devices disclosed herein, which utilize a plurality of OST-MTJ stacks that are connected in series by a conductive wire.

Figure 7:
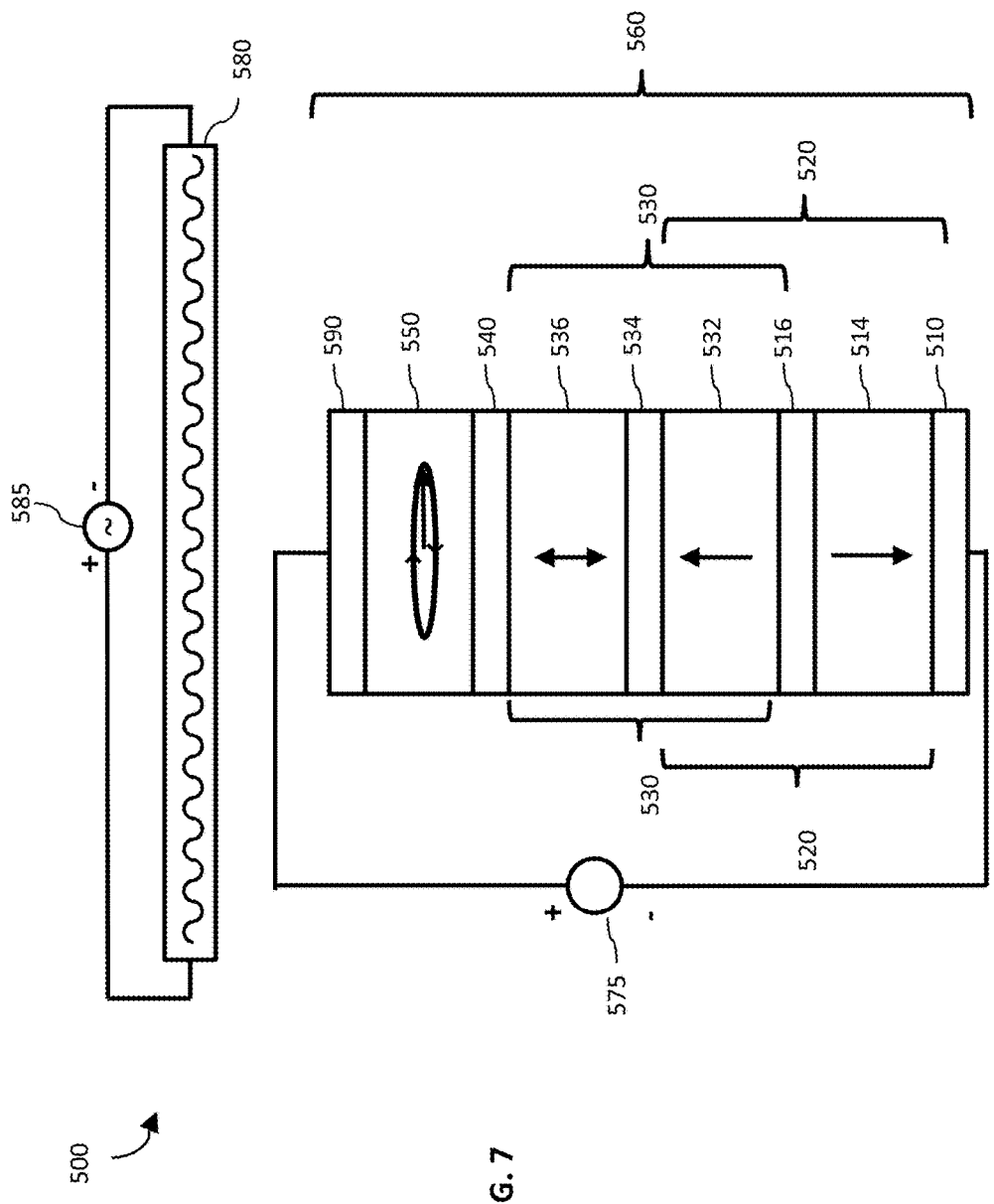
FIG. 7 illustrates an MTJ stack for an MRAM device utilizing an inducible precessional magnetic layer and an external wire that generates an external alternating magnetic field.

A memory cell with an inducible precessional magnetic layer 550, an external wire 580 and an MTJ structure 530 is shown in FIG. 7. MTJ 530 includes a reference layer 532 and a tunneling barrier layer (i.e., the insulator) 534 that is disposed over reference layer 532. The free layer 536 is disposed over tunneling barrier layer 534. As shown in FIG. 7, the magnetization vector of reference layer 532 has a magnetization direction that is preferably perpendicular to its plane, although variations of a several degrees are within the scope of what is considered perpendicular. As also seen in FIG. 7, free layer 536 also has a magnetization vector that is preferably perpendicular to its plane, but its direction can vary by 180 degrees. A nonmagnetic spacer 540 is disposed over of MTJ 530. Inducible precessional magnetic layer 550 is disposed over nonmagnetic spacer 540. In one embodiment, inducible precessional magnetic layer 550 has a magnetization vector having a magnetic vector with a component parallel to its plane, and perpendicular to the magnetic vector of the reference layer 532 and free layer 536. In one embodiment inducible precessional magnetic layer 550 has a magnetization vector having a magnetic vector that is parallel to its plane, and is perpendicular to the magnetic vector of the reference layer 532 and free layer 536. In such embodiments, the magnetization vector of inducible polarizer 550 has a magnetization direction that is preferably parallel to its plane, although variations of a several degrees are within the scope of what is considered parallel. In one embodiment, inducible precessional magnetic layer 550 has a magnetization vector that is able to precess around an axis perpendicular to its plane upon application of an external alternating magnetic field. In one embodiment, inducible precessional magnetic layer 550 has a magnetization vector having a vector component that rotates in its plane. The external magnetic field generator 570 includes first current source 585 and external wire 580. First current source 585 directs an electrical current comprising an alternating current through the external wire thereby generating an alternating magnetic field.

The various embodiments disclosed herein utilize a plurality of OST-MTJ stacks, such as OST-MTJ stack 560, connected in series by a conductive wire. One of the OST-MTJ stacks can be selectively written in the following manner: First, an external alternating magnetic field is generated that oscillates between a first magnetic field direction and a second magnetic field direction at a first frequency. The first frequency is resonant only with the selected OST-MTJ stack. Second, the external alternating magnetic field induces precession of magnetization vector of the inducible polarizer in the selected OST-MTJ stack. The magnetization vector of this inducible polarizer precesses or rotates at a first induced rotation frequency that is determined (i.e., caused) in part by the first frequency. Third, a programming current is generated. Fourth, the programming current is applied to the selected OST-MTJ stack, thereby generating a spin-polarized current having spin polarized electrons. Fifth, the spin-polarized current is injected into the free magnetic layer of the selected OST-MTJ stack, thereby exerting a first spin transfer torque on the magnetization vector of the free magnetic layer. In some embodiments, the spin transfer torque induces precession of the magnetization vector of the free layer, which precesses at a first predetermined precession frequency. The direction of the in-plane component of the spin transfer torque is at least in part determined (i.e., caused) by the direction of the magnetization vector of the inducible polarizer; therefore, the direction of the in-plane component of the spin torque rotates at the first induced rotation frequency. Because the first induced rotation frequency is matched to the first predetermined precession frequency, the in-plane component of the spin transfer torque assists in switching the magnetization vector of the free layer of the selected OST-MTJ stack.

Figure 8:
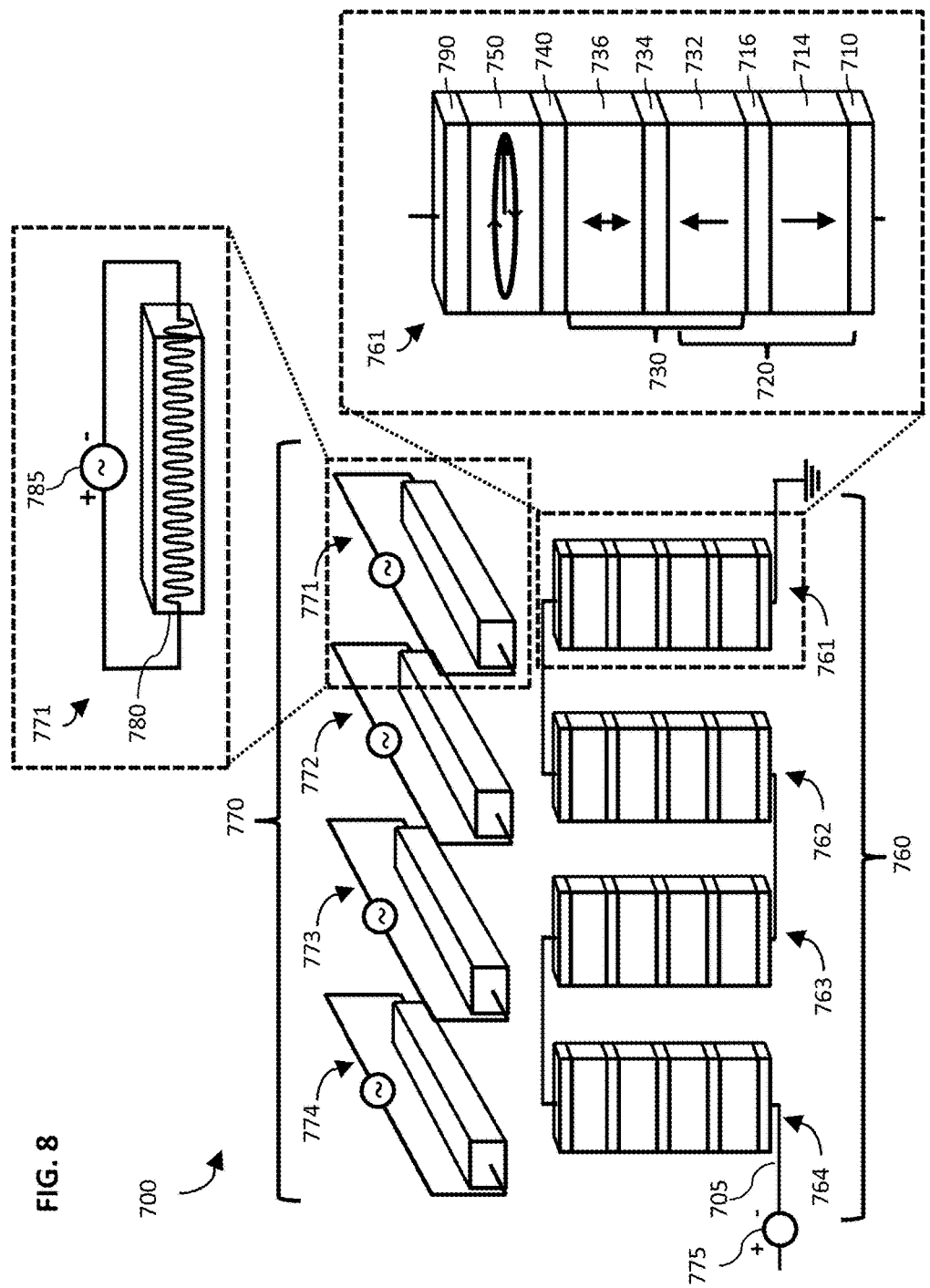
FIG. 8 illustrates a magnetic device for an MRAM device utilizing a plurality of OST-MTJ stack and a plurality of external magnetic field generators.

A memory cell with a plurality of OST-MTJ stacks 760 and a plurality of magnetic field generators 770 is shown in FIG. 8. Each OST-MTJ stack in the plurality of OST-MTJ stacks 760 is connected in series by conductive wire 705. The plurality of magnetic field generators 770 is physically separate from the plurality of OST-MTJ stack 760. However, device 700 is arranged such that each magnetic field generator is proximate to one unique corresponding OST-MTJ stack (i.e., magnetic field generator 771 is proximate to OST-MTJ stack 761, magnetic field generator 772 is proximate to OST-MTJ stack 762, etc.).

Each OST-MTJ stack includes the same basic features, which will be described with respect to OST-MTJ stack 761, depicted in FIG. 8. OST-MTJ structure 761 includes one or more seed layers 710 provided at the bottom of stack 761 to initiate a desired crystalline growth in the above-deposited layers. Synthetic antiferromagnetic (SAF) layer 720 is disposed over seed layer 710. SAF layer 720 is comprised of a first SAF layer 732, anti-ferromagnetic coupling layer 716 and second SAF layer 714. Second SAF layer 714 is deposited over seed layer 710, while anti-ferromagnetic coupling layer 716 is placed over second SAF layer 714. Magnetic tunnel junction (MTJ) 730 is deposited over anti-ferromagnetic coupling layer 716. MTJ 730 includes first SAF layer 732, which acts as the reference layer of the MTJ, and is also part of SAF layer 720. A tunneling barrier layer (i.e., the insulator) 734 is disposed over first SAF layer 732 while the free layer 736 is disposed over tunneling barrier layer 734. As shown in FIG. 8, the magnetization vector of first SAF layer 732 has a magnetization direction that is preferably perpendicular to its plane, although variations of a several degrees are within the scope of what is considered perpendicular. As also seen in FIG. 8, free layer 736 also has a magnetization vector that is preferably perpendicular to its plane, but its direction can vary by 180 degrees. A nonmagnetic spacer 740 is disposed over of MTJ 730. Induced precessional magnetic layer 750 is disposed over nonmagnetic spacer 740. In one embodiment, inducible precessional magnetic layer 750 has a magnetization vector having a magnetic vector with a component parallel to its plane, and perpendicular to the magnetic vector of the reference layer 732 and free layer 736. In one embodiment inducible precessional magnetic layer 750 has a magnetization vector having a magnetic vector that is parallel to its plane, and is perpendicular to the magnetic vector of the reference layer 732 and free layer 736. In such embodiments, the magnetization vector of the inducible polarizer 750 has a magnetization direction that is preferably parallel to its plane, although variations of a several degrees are within the scope of what is considered parallel. In one embodiments, inducible precessional magnetic layer 750 has a magnetization vector that is able to precess around an axis perpendicular to its plane upon application of an external alternating magnetic field. In one embodiment, inducible precessional magnetic layer 750 has a magnetization vector having a vector component that rotates in its plane. One or more capping layers 790 can be provided on top of inducible precessional magnetic layer 750 to protect the layers below on OST-MTJ stack 761. In some embodiments, these layers are all included in the same order in each OST-MTJ stack in the plurality of OST-MTJ stacks 760.

Seed layer 710 in the OST-MTJ structure 761 shown in FIG. 8 preferably comprises Ta, TaN, Cr, Cu, CuN, Ni, Fe or alloys thereof. Second SAF layer 714 preferably comprises either a Co/Ni, Co/Pt or Co/Pd multilayer structure. First SAF layer 732 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 716 is preferably made from Ru having thickness in the range of three to ten Angstroms. Tunneling barrier layer 734 is preferably made of an insulating material such as MgO, with a thickness of approximately ten Angstroms. Free layer 736 is preferably made with CoFeB deposited on top of tunneling barrier layer 734. Free layer 736 can also have layers of Fe, Co, Ni or alloys thereof and W and Ta insertion layers to promote perpendicular anisotropy. Spacer layer 740 over MTJ 730 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer, or 2-20 Angstroms $Al_2O_3$ layer.

Nonmagnetic spacer 740 has a number of properties. For example, nonmagnetic spacer 740 physically separates the free layer 736 and the in-plane polarization magnetic layer 750. Nonmagnetic spacer 740 transmits spin current efficiently from the in-plane polarization magnetic layer 750 into the free layer 736 because it preferably has a long spin diffusion length if made metallic. Nonmagnetic spacer 740 also promotes good microstructure and high tunneling magnetoresistance (TMR) and helps keep the damping constant of the free layer 736 low. In one embodiment, nonmagnetic space 740 comprises MgO. In one embodiment, nonmagnetic spacer 740 is of a thickness sufficient to prevent electronic and/or magnetic coupling of free magnetic layer 736 with inducible precessional magnetic layer 750.

The inducible precessional magnetic layer 750 is preferably made from CoFeB. It can also be made with Co, Fe, Ni magnetic layers or can be made out of their alloys. The magnetic alloys can also have boron, tantalum, copper or other materials. In some embodiments, the inducible precessional magnetic layer preferably has a weak or nonexistent in-plane uniaxial anisotropy and preferably a low magnetic moment. This allows the magnetic vector of the inducible polarizer to be driven by the alternating magnetic field, thereby remaining at the inducible precession frequency set, in part, by the oscillating frequency of the magnetic field. If the in-plane anisotropy or magnetic moment is too strong, the magnetization vector of the inducible polarizer would not properly follow the applied alternating magnetic field when being driven at a high frequency. Finally capping layer 790 can be any material that provides good interface to the in-plane layer such as Ta, TaN, Ru, MgO, Cu, etc.

In some embodiments, second current source 775 can generate a programming current pulse that comprises a direct current. In some embodiments, second current source 775 can generate a direct current. Second current source 775 can also generate programming currents with various ratios of alternating current and direct current. In some embodiments, second current source 775 can generate a programming current comprising a direct current and the current strength of the direct current can be changed from a first direct current value to a second direct current value.

Each magnetic field generator of the plurality of magnetic field generators 770 includes the same basic features, which will be described with respect to magnetic field generator 771, depicted in FIG. 8. Magnetic field generator 771 can generally comprise, for example, a first current source 785 and external wire 780. External wire 780 has a number of properties. External wire 780 is preferably a good conductor of electrical current. In some embodiments, external wire 780 is a metal or a metallic material. External wire 780 preferably generates an alternating magnetic field upon application of an alternating electrical current to the external wire 780. In some embodiments, external wire 780 of magnetic field generator 771 is not directly connected to OST-MTJ stack 761. In some embodiments, external wire 780 is preferably proximate to MTJ stack 761 such that the alternating magnetic field generated by the passage of an alternating current through external wire 780 can interact with the magnetization vector of the inducible precessional magnetic layer 750. In some embodiments, external wire 780 is preferably proximate to MTJ stack 760 such that the alternating magnetic field can interact with the magnetization vector of the free magnetic layer 736.

In one embodiment, the distance between magnetic field generator 771 and OST-MTJ stack 761 is less than 200 nanometers. In one embodiment, the distance between magnetic field generator 771 and OST-MTJ stack 761 is less than 50 nanometers. In one embodiment, t the distance between magnetic field generator 771 and OST-MTJ stack 761 is less than 10 nanometers.

In some embodiments, first current source 785 generates an alternating current. In some embodiments, first current source 785 generates electrical current comprising an alternating current. In some embodiments, first current source 785 generates an electrical current that comprises an alternating current and a direct current. In some embodiments, first current source 785 directs an electrical current comprising an alternating current through the external wire 780 thereby generating an external alternating magnetic field. In addition, first current source 785 can be configured to produce an alternating current having an oscillation frequency that generates an external alternating magnetic field that is matched to the predetermined precession frequency of the free magnetic layer 736. In addition, first current source 785 can be configured to produce an alternating current having an oscillation frequency that is matched to the predetermined precession frequency of the free magnetic layer 736.

The manner in which a bit is written using magnetic device 700 comprising plurality of OST-MTJ stacks 760 and the corresponding plurality of magnetic field generators 771 will now be described. As discussed above, each OST-MTJ stack has a corresponding magnetic field generator that is used to activate that specific OST-MTJ stack for writing (i.e., magnetic field generator 771 activates OST-MTJ stack 761, magnetic field generator 772 activates OST-MTJ stack 762, etc.). Thus, when a particular OST-MTJ stack has been selected for writing, the corresponding magnetic field generator is activated. This process will be described for the writing of OST-MTJ stack 761 in FIG. 8, but an analogous procedure would be used to write any other OST-MTJ stack in plurality 760.

When OST-MTJ stack 761 is selected for writing, the stack is activated by the corresponding magnetic field generator 771. In particular, a first electrical current is supplied, for example, by first current source 785, which passes electrical current through external wire 780. Passage of the first electrical current through external wire 780 generates a magnetic field proximate to the external wire 780. In one embodiment, the first electrical current comprises an alternating current. Application of this alternating current to external wire 780 generates a first alternating magnetic field proximate to external wire 780. The magnetization direction of the first magnetic field oscillates between a first field direction and a second field direction at an oscillation frequency, which is at least in part determined by the alternating current frequency and the structure of external wire 780. In some embodiments, the first alternating magnetic field exerts a force on the magnetization vector of inducible precessional magnetic layer (i.e., inducible polarizer) 750 of the OST-MTJ stack 761. The first alternating magnetic field causes the magnetization vector of inducible polarizer 750 to precess around an axis perpendicular to the plane or rotate in the plane of the inducible polarizer 750 at an specified precession frequency (i.e., the induced rotation frequency). The induced rotation frequency is at least in part determined by oscillating frequency of the external alternating magnetic field and the structure (i.e., dimensions and composition) of the inducible polarizer 750 of OST-MTJ stack 761. The magnetization vector of the inducible polarizer 750 continues to precess or rotate at this induced rotation frequency as long as the first alternating magnetic field is being applied to the inducible polarizer 750.

A second electrical current is supplied, for example, by second current source 775, which passes electrical current through the plurality of the OST-MTJ stacks 760. Application of the second electrical current (i.e., programming current) to OST-MTJ stack 761 creates a spin polarized current that passes through the following layers of OST-MTJ stack 761: the non-magnetic spacer layer 740, free magnetic layer 736, tunneling barrier layer 734, and reference magnetic layer 732. The spin polarized current exerts a spin transfer torque on free magnetic layer 736, which helps overcome the inherent damping of the magnetic material making up the free layer 736. The spin transfer torque is composed of an in-plane spin transfer torque and a perpendicular spin transfer torque. In one embodiment, when switching the free layer 736 in one direction (e.g., from the parallel direction to the anti-parallel direction), the in-plane spin transfer torque is caused by the transverse spin current generated by the inducible polarizer 750 and the perpendicular spin transfer torque is caused by the reflected spin current generated by the reference magnetic layer 732. As discussed above, the transverse spin current from inducible polarizer 750 exerts an in-plane spin transfer torque 610 on the magnetization vector that is aligned with the magnetization vector 570 of the inducible polarizer 750. Because the external alternating magnetic field causes rotation of the in-plane component of magnetization vector 570 at the induced rotation frequency, the direction of in-plane spin transfer torque 610 rotates at the same induced rotation frequency, as depicted in FIG. 6a.

The spin current causes the magnetization vector the free magnetic layer 736 to precess about its axis, which is shown in FIG. 6a. In some embodiments, the first alternating magnetic field interacts directly with the magnetization vector of free layer 736, thereby initiating or enhancing the precession of the free layer 736. As also discussed above, the precession of the magnetic vector of free magnetic layer 736 occurs at a predetermined precession frequency when the magnetization angle is relatively low (i.e., the magnetization vector 200' is within roughly 10 degrees of perpendicular axis 202). In some embodiments, the induced rotation frequency is synchronized with the predetermined precession frequency. The precession of magnetization vector 570 of inducible polarizer 750 will match the precession of magnetization vector 200' while magnetization vector 200' precesses at the predetermined precession frequency (i.e., when the magnetization angle of magnetization vector 200' is low). In some embodiments, the direction of the in-plane component of magnetization vector 570 will be aligned with (i.e., parallel to) the in-plane component of magnetization vector 200' throughout its precession. Therefore, as depicted in FIG. 6a, the transverse spin current will exert a spin transfer torque 610 on magnetization vector 200' that pushes magnetization vector 200' away from perpendicular axis 202 throughout the entire precession. In this way, the inducible polarizer 750 enhances the efficiency of switching the free layer 736 in the presence of the first alternating magnetic field and the programming current.

Although the programming current is applied to all OST-MTJ stacks in the plurality 760, only the free layer of 736 of OST-MTJ stack 761 is switched. This is because magnetic field generator 771 only activates OST-MTJ stack 761 (i.e., magnetic field generator 771 only induces precession of the inducible polarizer of OST-MTJ stack 761). In some embodiments, the inducible polarizer of, for example, neighboring OST-MTJ stack 762 is not induced into precession by the first alternating magnetic field; rather, the magnetization vector of the inducible polarizer of OST-MTJ stack 762 remains fixed. Therefore, the in-plane component of the spin transfer torque generated by the inducible polarizer of OST-MTJ stack 762 does not provide a net benefit for switching the free layer of OST-MTJ stack 762. In other embodiments, the inducible polarizer of OST-MTJ stack 762 does precess, but at a frequency that is not resonant with the predetermined precession frequency of the free layer of OST-MTJ stack 762 and therefore provides no net benefit. Without the beneficial spin transfer torque conferred by an inducible polarizer that is precessing in resonance with the free layer, the programming current is not strong enough to switch the free layer of any OST-MTJ stack. Thus, as only the inducible polarizer 750 of MTJ stack 761 is activated by the first alternating magnetic field, only the free layer of OST-MTJ stack 761 is switched.

Selective activation of OST-MTJ stack 761 by the first alternating magnetic field can be accomplished by at least two mechanisms. First, only OST-MTJ stack 761 is close enough to external magnetic field generator 771 to be influenced by the first alternating magnetic field. The first alternating magnetic field's influence on the other OST-MTJ stacks is too weak to induce precession of the inducible polarizer. Thus, only the inducible polarizer 750 of OST-MTJ stack 761 is activated. Second, the device can be designed such that different sets of magnetic field generators and OST-MTJ stacks operate at different non-overlapping frequencies. For example, magnetic field generator 771 can generate a first alternating magnetic field that oscillates at a first frequency, which is the frequency required to induce precession of the inducible polarizer of OST-MTJ stack 761. Magnetic field generator 772 can generate a second alternating magnetic field that oscillates at a second frequency, which is the frequency required to induce precession of the inducible polarizer of OST-MTJ stack 762. The OST-MTJ stack 761 cannot be activated by alternating magnetic fields that oscillate at the second frequency (i.e., the second alternating magnetic field). In some embodiments, this is because the second frequency is not resonant with the free magnetic layer of OST-MTJ stack 761. Thus, even if it does induce precession of the inducible polarizer, the polarizer will not precess at a frequency that is synchronized with the predetermined precession frequency of the free layer. Thus, the inducible polarizer will not provide beneficial spin transfer torque. In some embodiments, the second frequency is not resonant with the inducible polarizer of OST-MTJ stack 761; therefore, the second alternating magnetic field does not induce precession or rotation that inducible polarizer. Similarly, the OST-MTJ stack 762 cannot be activated by alternating magnetic fields that oscillate at the first frequency (i.e., the first alternating magnetic field). Therefore, OST-MTJ stack 761 can be selectively written (with minimal influence on the free layer of OST-MTJ stack 762) when the magnetic field generator 771 creates the first alternating magnetic field.

A similar process is utilized when writing the bit from the antiparallel state to the parallel state, the dynamics of which are illustrated in FIG. 6b. In one embodiment, the magnetization vector 570 rotates at the predetermined rotation frequency in the same direction as the precessions of magnetization vector 200'; however the in-plane direction the in-plane component of magnetization vector 570 is antiparallel to the in-plane magnetization vector of 200'. As discussed above, the spin transfer torque 610' (generated by the reflected spin current from inducible polarizer 750) is aligned with the in-plane magnetization vector of 200' when the in-plane components of magnetization vectors 570 and 200' are antiparallel to each other. Therefore, in embodiments where the induced rotation frequency is matched to the predetermined precession frequency, magnetization vectors 570 and 200' can maintain this antiparallel orientation throughout the precession of magnetization vector 200'. Such antiparallel synchronization is possible because free layer 736 and inducible polarizer 750 are not electronically or magnetically coupled; rather, the rotation of magnetization vector 570 is controlled by the external alternating magnetic field. As a result of this synchronization, as depicted in FIG. 6b, the reflected spin current can exert a spin transfer torque 610' on magnetization vector 200' that pushes magnetization vector 200' away from perpendicular axis 202 throughout the entire precession. In this way, the inducible polarizer 750 enhances the efficiency of switching the free layer 736 in the presence of the external alternating magnetic field and the programming current, even when switching from the antiparallel state to the parallel state. In other embodiments, the magnetic direction of the magnetic vector of inducible polarizer 750 rotates in the opposite direction as the magnetic vector of free layer 736. In some embodiments, the direction that the magnetization vector of the inducible polarizer precesses or rotates is set by an external force. In some embodiments, this direction of precession or rotation is set in part by an external uniform magnetic field. In one embodiment, this direction of precession or rotation is set in part by fringing fields from the reference layer.

Magnetic devices that utilize inducible polarizers, such as magnetic device 700, offer additional advantages during the reading process. In particular, these devices offer all of the advantages, described above, for improved switching during the writing process, but also allow a significantly reduced read disturb probability. Synchronization of the inducible polarizer 750 with the precession of free layer 736 allows for a reduced threshold switching current (i.e., lower current values are required to switch the magnetization direction of free layer 736 for the selected OST-MTJ stack. This reduced threshold switching current is how magnetic devices such as 700 allow for selective writing of specific OST-MTJ stacks when a plurality of OST-MTJ stacks are connected in series. Additional advantages afforded by this lower switching threshold include reduction in write error rate, reduced damage to the device during each writing process, and an increase in device stability over time. However, lower switching threshold currents can increase the probability of inadvertently writing the bit during the read process. Typically, a weaker current is used during the read process, allowing the resistance across the OST-MTJ stack to be measured without generating a spin-current that is strong enough to switch the magnetic vector of the free layer. However, when an inducible polarizer is used as described above, the strength of the current required to switch the free layer is greatly reduced. Therefore, unless these systems can be bypassed, there will be a substantial probability of inadvertently switching the free layer during the reading process (i.e., read disturb), even if a weaker read current is used.

In devices such as magnetic device 700, the rotation of the magnetization vector 770 of the inducible polarizer is in any OST-MTJ stack is controlled in part by the corresponding magnetic field generator. In the absence of the corresponding alternating magnetic field, the magnetic vector of the inducible polarizer 750 does not rotate, and as a result, switching the bit requires a significantly stronger programming current. Thus, the bit can be read in the absence of the external alternating magnetic field (i.e., with no alternating current running through external wire 780), thereby allowing the resistance across, for example, OST-MTJ stack 761 to be read with a very low read disturb probability. In some embodiments, the magnetic vector of the free layer 736 will not switch in the absence of the corresponding alternating magnetic field, thereby allowing the bit to be read with essentially zero probability of read disturb. This is particularly advantageous when the OST-MTJ stacks are connected in series, as in the various embodiments disclosed herein. Connection of the stacks in series results in the read current passing through several OST-MTJ stacks when measuring the resistance. If each OST-MTJ stack in the series is activated during the each read, then the probability of read disturb is greatly increased. Thus, the ability to decouple the induced polarizer from the read current is particularly advantageous in where there are multiple OST-MTJ stacks connected in series.

A destructive read process can be used to read magnetic devices that utilize a plurality of OST-MTJ stacks that are connected in series, such as magnetic device 700. Generally, one method for this destructive read process entails first measuring the resistance across the series of OST-MTJ stacks in a manner similar to reading the resistance across a single OST-MTJ stack. This first resistance value is then temporarily stored (e.g., by using a capacitor). Second, the bit to be read is activated for writing (by the application of the corresponding alternating magnetic field to the selected OST-MTJ stack), and the programming current is passed through the plurality of OST-MTJ stacks, thereby writing the selected bit in one direction (e.g., switching from parallel to antiparallel). Third, the resistance across the series of OST-MTJ stacks is measured again and this second resistance value is temporarily stored. Fourth, the first resistance value is compared to the second resistance value to determine the initial orientation of the selected OST-MTJ stack. If the stack was originally in a parallel orientation, the first resistance value would be different than second resistance value (which was measured after the bit had been flipped from parallel to antiparallel). However, if the selected OST-MTJ stack was originally in an antiparallel orientation, the first resistance value and the second resistance value would be equal (because the selected OST-MTJ stack was in the antiparallel position during both reads). Fourth, if necessary, the selected OST-MTJ stack is written back to the parallel position.

Such a destructive read process would not work in magnetic devices where the OST-MTJ stacks are connected in series unless specific bits can be selectively activated for writing. Without the ability to selectively write, measuring the resistance across the plurality of OST-MTJs would not allow reading of a particular bit. This is because there are multiple degenerate states that give the same resistances value (e.g., the same resistance value would be read if (1) the first three OST-MTJ stacks were parallel and only the fourth OST-MTJ stack was antiparallel and (2) the first OST-MTJ stack was antiparallel and the last three OST-MTJ stacks were parallel). The use of OST-MTJ stacks comprising an inducible polarizer allow for selective activation using an external stimuli (e.g., an alternating magnetic field), thereby facilitating the use of a destructive read process. Therefore, the various embodiments disclosed herein offer the additional advantage of permitting the use of a destructive read process, thereby allowing multiple OST-MTJ stacks to be connected in series. This, in turn, reduces the number of current sources used to write the bits because on current source can be used for multiple OST-MTJ stacks, thereby increasing the potential memory density of the MRAM device. Thus, the various embodiments disclosed herein allow for the construction of MRAM devices having increased memory density.

Figure 9:
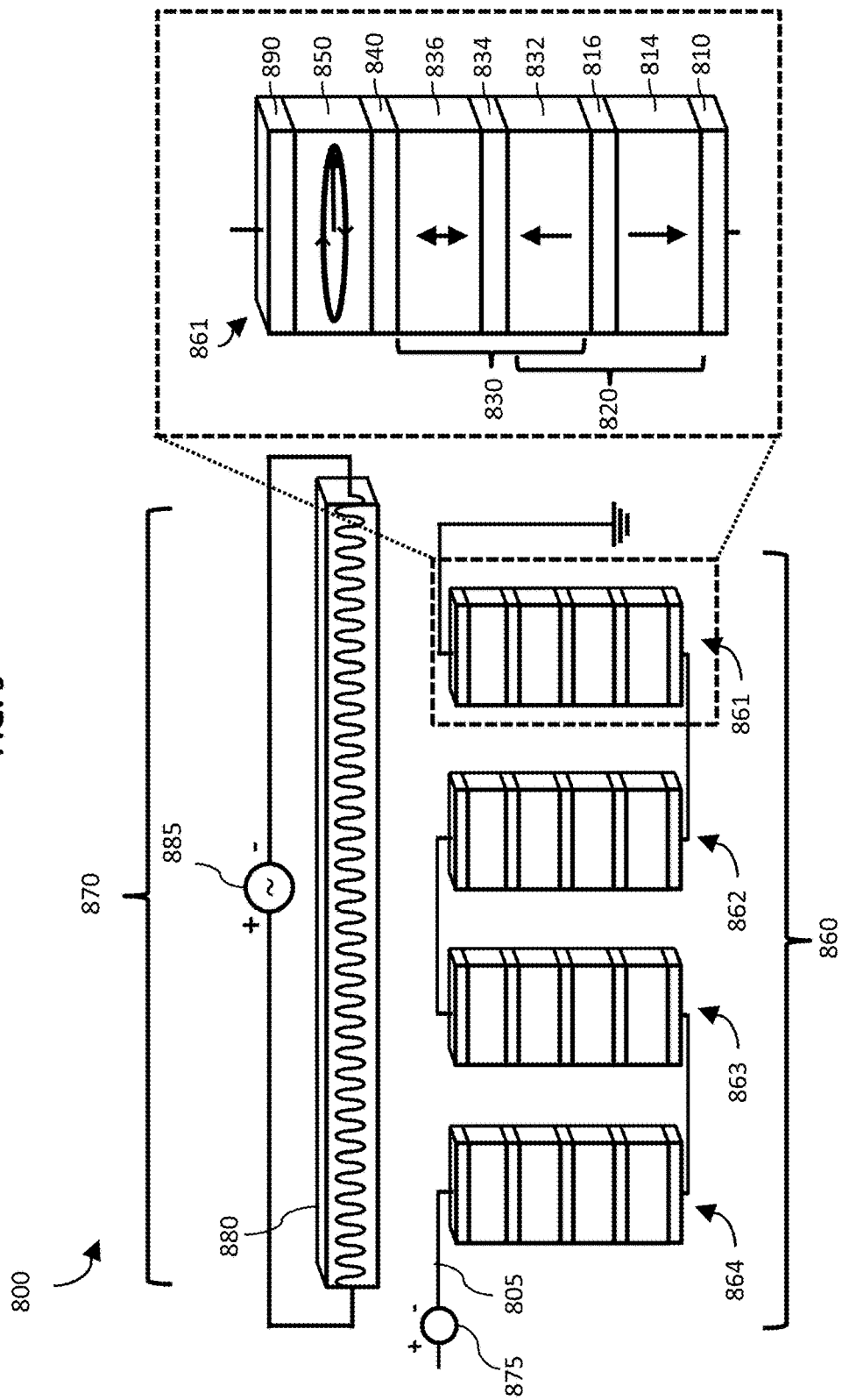
FIG. 9 illustrates an magnetic device for an MRAM device utilizing a plurality of OST-MTJ stack, each with different resonant frequencies, and a single external magnetic field generator, capable of generating alternating magnetic fields at matching frequencies.

A memory cell with a plurality of OST-MTJ stacks 860 and a single multifunctional magnetic field generator 870 is shown in FIG. 9. Each OST-MTJ stack in the plurality of OST-MTJ stacks 860 is connected in series by conductive wire 805. The magnetic field generator 870 is physically separate from the plurality of OST-MTJ stack 860. However, device 800 is arranged such that each OST-MTJ stack is proximate to the magnetic field generator 870 such that each OST-MTJ stack can interact with the magnetic fields created by the magnetic field generator 870. Each OST-MTJ stack includes the same basic features, which will be described with respect to OST-MTJ stack 861, depicted in FIG. 9. OST-MTJ structure 861 includes one or more seed layers 810 provided at the bottom of stack 861 to initiate a desired crystalline growth in the above-deposited layers. Synthetic antiferromagnetic (SAF) layer 820 is disposed over seed layer 810. SAF layer 820 is comprised of a first SAF layer 832, anti-ferromagnetic coupling layer 816 and second SAF layer 814. Second SAF layer 814 is deposited over seed layer 810, while anti-ferromagnetic coupling layer 816 is placed over second SAF layer 814. Magnetic tunnel junction (MTJ) 830 is deposited over anti-ferromagnetic coupling layer 816. MTJ 830 includes first SAF layer 832, which acts as the reference layer of the MTJ, and is also part of SAF layer 820. A tunneling barrier layer (i.e., the insulator) 834 is disposed over first SAF layer 832 while the free layer 836 is disposed over tunneling barrier layer 834. As shown in FIG. 9, the magnetization vector of first SAF layer 832 has a magnetization direction that is preferably perpendicular to its plane, although variations of a several degrees are within the scope of what is considered perpendicular. As also seen in FIG. 9, free layer 836 also has a magnetization vector that is preferably perpendicular to its plane, but its direction can vary by 180 degrees. A nonmagnetic spacer 840 is disposed over of MTJ 830. Induced precessional magnetic layer 850 is disposed over nonmagnetic spacer 840. In one embodiment, inducible precessional magnetic layer 850 has a magnetization vector having a magnetic vector with a component parallel to its plane, and perpendicular to the magnetic vector of the reference layer 832 and free layer 836. In one embodiment inducible precessional magnetic layer 850 has a magnetization vector having a magnetic vector that is parallel to its plane, and is perpendicular to the magnetic vector of the reference layer 832 and free layer 836. In such embodiments, the magnetization vector of the inducible polarizer 850 has a magnetization direction that is preferably parallel to its plane, although variations of a several degrees are within the scope of what is considered parallel. In one embodiments, inducible precessional magnetic layer 850 has a magnetization vector that is able to precess around an axis perpendicular to its plane upon application of an external alternating magnetic field. In one embodiment, inducible precessional magnetic layer 850 has a magnetization vector having a vector component that rotates in its plane. One or more capping layers 890 can be provided on top of inducible precessional magnetic layer 850 to protect the layers below on OST-MTJ stack 861. In some embodiments, these layers are all included in the same order in each OST-MTJ stack in the plurality of OST-MTJ stacks 860.

Seed layer 810 in the OST-MTJ structure 861 shown in FIG. 9 preferably comprises Ta, TaN, Cr, Cu, CuN, Ni, Fe or alloys thereof. Second SAF layer 814 preferably comprises either a Co/Ni, Co/Pt or Co/Pd multilayer structure. First SAF layer 832 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 816 is preferably made from Ru having thickness in the range of three to ten Angstroms. Tunneling barrier layer 834 is preferably made of an insulating material such as MgO, with a thickness of approximately ten Angstroms. Free layer 836 is preferably made with CoFeB deposited on top of tunneling barrier layer 834. Free layer 836 can also have layers of Fe, Co, Ni or alloys thereof and W and Ta insertion layers to promote perpendicular anisotropy. Spacer layer 840 over MTJ 830 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer, or 2-20 Angstroms $Al_2O_3$ layer.

Nonmagnetic spacer 840 has a number of properties. For example, nonmagnetic spacer 840 physically separates the free layer 836 and the in-plane polarization magnetic layer 850. Nonmagnetic spacer 840 transmits spin current efficiently from the in-plane polarization magnetic layer 850 into the free layer 836 because it preferably has a long spin diffusion length if made metallic. Nonmagnetic spacer 840 also promotes good microstructure and high tunneling magnetoresistance (TMR) and helps keep the damping constant of the free layer 836 low. In one embodiment, nonmagnetic space 840 comprises MgO. In one embodiment, nonmagnetic spacer 840 is of a thickness sufficient to prevent electronic and/or magnetic coupling of free magnetic layer 836 with inducible precessional magnetic layer 850.

The inducible precessional magnetic layer 850 is preferably made from CoFeB. It can also be made with Co, Fe, Ni magnetic layers or can be made out of their alloys. The magnetic alloys can also have boron, tantalum, copper or other materials. Finally capping layer 890 can be any material that provides good interface to the in-plane layer such as Ta, TaN, Ru, MgO, Cu, etc.

In some embodiments, second current source 875 can generate a programming current pulse that comprises a direct current. In some embodiments, second current source 875 can generate a direct current. Second current source 875 can also generate programming currents with various ratios of alternating current and direct current. In some embodiments, second current source 875 can generate a programming current comprising a direct current and the current strength of the direct current can be changed from a first direct current value to a second direct current value.

Magnetic field generator 870 depicted in FIG. 9 can generally comprise, for example, first current source 885 and external wire 880. External wire 880 has a number of properties. External wire 880 is preferably a good conductor of electrical current. In some embodiments, external wire 880 is a metal or a metallic material. External wire 880 preferably generates an alternating magnetic field upon application of an alternating electrical current to the external wire 780. Preferably, the oscillation frequency of the alternating magnetic field is dependent on the frequency of the alternating current applied to the external wire 880 (i.e., the alternating current frequency). In some embodiments, external wire 880 of magnetic field generator 870 is not directly connected to the plurality of OST-MTJ stacks 860. In some embodiments, external wire 880 is preferably proximate to each OST-MTJ stack in plurality 860 such that the alternating magnetic field generated by the passage of an alternating current through external wire 880 can interact with the magnetization vector of the inducible precessional magnetic layer 850 of each respective OST-MTJ stack. In some embodiments, external wire 880 is preferably proximate to each OST-MTJ stack in plurality 860 such that the alternating magnetic field generated by the passage of an alternating current through external wire 880 can interact with the magnetization vector of the free magnetic layer 850 of each respective OST-MTJ stack.

In one embodiment, the distance between magnetic field generator 870 and the plurality of OST-MTJ stacks 860 is less than 200 nanometers. In one embodiment, the distance between magnetic field generator 870 and the plurality of OST-MTJ stacks 860 is less than 50 nanometers. In one embodiment, the distance between magnetic field generator 870 and the plurality of OST-MTJ stacks 860 is less than 10 nanometers.

In some embodiments, first current source 885 generates an alternating current. In some embodiments, first current source 885 generates electrical current comprising an alternating current. In some embodiments, first current source 885 generates an electrical current that comprises an alternating current and a direct current. In some embodiments, first current source 885 directs an electrical current comprising an alternating current through the external wire 880 thereby generating an external alternating magnetic field. In addition, first current source 885 can be configured to produce an alternating current having an oscillation frequency that generates an external alternating magnetic field that is matched to the predetermined precession frequency of the free magnetic layer 836 for each OST-MTJ stack in the plurality 860. In addition, first current source 885 can be configured to produce alternating currents, each having an oscillation frequency that is matched to the predetermined precession frequency of the free magnetic layer 836 for one OST-MTJ stack in the plurality 860. Preferably, first current source 885 is capable of directing a set of alternating currents through external wire 880, with each alternating current having a unique non-overlapping alternating current frequency. More preferably, each alternating current frequency of the set of alternating currents is resonant with the inducible polarizer 850 of one unique OST-MTJ stack (i.e., the first frequency is resonant only with OST-MTJ stack 861, the second frequency is resonant only with OST-MTJ stack 862, etc.).

The manner in which a bit is written using magnetic device 800 comprising a plurality of OST-MTJ stacks 860 and a single multifunctional magnetic field generator 870 will now be described. As discussed above, each OST-MTJ stack in plurality 860 has its own inducible polarizer and free magnetic layer. Preferably, each inducible polarizer has its own unique non-overlapping induced rotation frequency (i.e., inducible polarizer 850 of OST-MTJ stack 861 has a first induced rotation frequency, inducible polarizer of OST-MTJ stack 862 has a second induced rotation frequency, etc.). Similarly, each free magnetic layer has its own unique non-overlapping predetermined precession frequency (i.e., free layer 836 of OST-MTJ stack 861 has a first predetermined precession frequency, the free layer of OST-MTJ stack 862 has a second predetermined precession frequency, etc.). Thus, each OST-MTJ stack can be activated by different alternating magnetic fields, each having a unique non-overlapping oscillation frequency that resonates with the magnetization vectors of one corresponding OST-MTJ stack (i.e., a first frequency activates OST-MTJ stack 861, a second frequency activates OST-MTJ stack 862, etc.). This process will be described for the writing of OST-MTJ stack 861 in FIG. 9, but an analogous procedure would be used to write any other OST-MTJ stack in plurality 860.

When OST-MTJ stack 861 is selected for writing, the stack is selectively activated by the magnetic field generator 870. In particular, a first electrical current is supplied, for example, by first current source 885, which passes electrical current through external wire 880. Passage of the first electrical current through external wire 880 generates a magnetic field proximate to the external wire 880. The first electrical current comprises an alternating current. Application of this alternating current to external wire 880 generates a first alternating magnetic field proximate to external wire 880. The magnetization direction of the first alternating magnetic field oscillates between a first field direction and a second field direction at an oscillation frequency, which is at least in part determined by the alternating current frequency. The alternating frequency of the first electrical current has been selected to cause the first alternating magnetic field to oscillate at a specific frequency (i.e., the first frequency), known to be specifically resonant with OST-MTJ stack 861. In some embodiments, the first alternating magnetic field exerts a force on the magnetization vector of inducible precessional magnetic layer (i.e., inducible polarizer) 850 of the OST-MTJ stack 861. The first alternating magnetic field causes the magnetization vector of inducible polarizer 750 of OST-MTJ stack 861 to precess or rotate at a known frequency (i.e., the first induced rotation frequency) around an axis perpendicular to the plane of the inducible polarizer 850. This first induced rotation frequency is at least in part determined (i.e., caused) by the oscillating frequency of the external alternating magnetic field (i.e., the first frequency) and the structure (i.e., dimensions and composition) of the inducible polarizer 850 of OST-MTJ stack 861. The magnetization vector of the inducible polarizer 850 continues to precess at this first induced rotation frequency as long as the first alternating magnetic field is being generated.

A second electrical current is supplied, for example, by second current source 875, which passes electrical current through the plurality of the OST-MTJ stacks 860. Application of the second electrical current (i.e., programming current) to OST-MTJ stack 861 creates a first spin polarized current that passes through the following layers of OST-MTJ stack 861: the non-magnetic spacer layer 840, free magnetic layer 836, tunneling barrier layer 834, and reference magnetic layer 832. The first spin polarized current exerts a first spin transfer torque on free magnetic layer 836, which helps overcome the inherent damping of the magnetic material making up the free layer 836. The first spin transfer torque is composed of an in-plane spin transfer torque and a perpendicular spin transfer torque. In one embodiment, when switching the free layer 836 in one direction (e.g., from the parallel direction to the anti-parallel direction), the in-plane spin transfer torque is caused by the transverse spin current generated by the inducible polarizer 850 and the perpendicular spin transfer torque is caused by the reflected spin current generated by the reference magnetic layer 832. As discussed above, the transverse spin current from inducible polarizer 850 exerts an in-plane spin transfer torque 610 on the magnetization vector that is aligned with the magnetization vector 570 of the inducible polarizer 850. Because the external alternating magnetic field causes rotation of the in-plane component of magnetization vector 570 at the induced rotation frequency, the direction of in-plane spin transfer torque 610 rotates at the same induced rotation frequency, as depicted in FIG. 6a.

The first spin current causes the magnetization vector the free magnetic layer 836 to precess about its axis, which is shown in FIG. 6a. In some embodiments, the first alternating magnetic field interacts directly with the magnetization vector of free layer 836, thereby initiating or enhancing the precession of the free layer 836. As also discussed above, the precession of the magnetic vector of free magnetic layer 836 occurs at a first predetermined precession frequency when the magnetization angle is relatively low (i.e., the magnetization vector 200' is within roughly 10 degrees of perpendicular axis 202). In some embodiments, the first induced rotation frequency is synchronized with the first predetermined precession frequency. The precession of magnetization vector 570 of inducible polarizer 850 will match the precession of magnetization vector 200' while magnetization vector 200' precesses at the predetermined precession frequency (i.e., when the magnetization angle of magnetization vector 200' is low). In some embodiments, the direction of the in-plane component of magnetization vector 570 will be aligned with (i.e., parallel to) the in-plane component of magnetization vector 200' throughout its precession. Therefore, as depicted in FIG. 6a, the transverse spin current will exert a spin transfer torque 610 on magnetization vector 200' that pushes magnetization vector 200' away from perpendicular axis 202 throughout the entire precession. In this way, the inducible polarizer 850 enhances the efficiency of switching the free layer 836 in the presence of the first alternating magnetic field and the programming current.

Although the programming current is applied to all OST-MTJ stacks in the plurality 860, only the free layer of 836 of OST-MTJ stack 861 is switched. This is because magnetic field generator 870 only activates OST-MTJ stack 861 (i.e., magnetic field generator 870 only induces precession of the inducible polarizer of OST-MTJ stack 861) when magnetic field generator 870 generates the first alternating magnetic field. In some embodiments, the inducible polarizer of, for example, neighboring OST-MTJ stack 862 in not induced into precession by the first alternating magnetic field; rather, the magnetization vector of the inducible polarizer of OST-MTJ stack 862 remains fixed in the presence of the first alternating magnetic field. Therefore, the in-plane component of the spin transfer torque generated by the inducible polarizer of OST-MTJ stack 862 does not provide a net benefit for switching the free layer of OST-MTJ stack 862. In other embodiments, the inducible polarizer of OST-MTJ stack 862 does precess, but at a frequency that is not resonant with the predetermined precession frequency of the free layer of OST-MTJ stack 862 and therefore provides no net benefit. Without the beneficial spin transfer torque conferred by a inducible polarizer that is precessing in resonance with the free layer, the programming current is not strong enough to switch the free layer of any OST-MTJ stack. Thus, as only the inducible polarizer 850 of MTJ stack 861 is activated by the first alternating magnetic field, only the free layer of OST-MTJ stack 861 is switched.

Selective activation of OST-MTJ stack 861 by the first alternating magnetic field can be accomplished because the device can be designed such that different OST-MTJ stacks are activated at different non-overlapping frequencies. For example, as discussed above, magnetic field generator 870 can generate a first alternating magnetic field that oscillates at a first frequency, which is the frequency required to induce precession of the inducible polarizer of OST-MTJ stack 861. Magnetic field generator 870 can also generate a second alternating magnetic field that oscillates at a second frequency, which is the frequency required to induce precession of the inducible polarizer of OST-MTJ stack 862. The OST-MTJ stack 861 cannot be activated by alternating magnetic fields that oscillate at the second frequency (i.e., the second alternating magnetic field). In some embodiments, this is because the second frequency is not resonant with the free magnetic layer of OST-MTJ stack 861. Thus, even if it does induce precession of the inducible polarizer, the polarizer will not precess at a frequency that is synchronized with the predetermined precession frequency of the free layer. Thus, the inducible polarizer will not provide beneficial spin transfer torque. In some embodiments, the second frequency is not resonant with the inducible polarizer of OST-MTJ stack 861; therefore, the second alternating magnetic field does not induce precession or rotation that inducible polarizer. Similarly, the OST-MTJ stack 862 cannot be activated by alternating magnetic fields that oscillate at the first frequency (i.e., the first alternating magnetic field). Therefore, OST-MTJ stack 861 can be selectively written (with minimal influence on the free layer of OST-MTJ stack 862) when the magnetic field generator 870 creates the first alternating magnetic field.

As discussed above, a destructive read process can be used to read magnetic devices that utilize a plurality of OST-MTJ stacks that are connected in series, such as magnetic device 800. Also as discussed above, the use of a plurality of OST-MTJ stacks connected in series, reduces the number of current sources used to write the bits because on current source can be used for multiple OST-MTJ stacks, thereby increasing the potential memory density of the MRAM device. Thus, the various embodiments disclosed herein, such as magnetic device 800, allow for the construction of MRAM devices having increased memory density.

Figure 10:
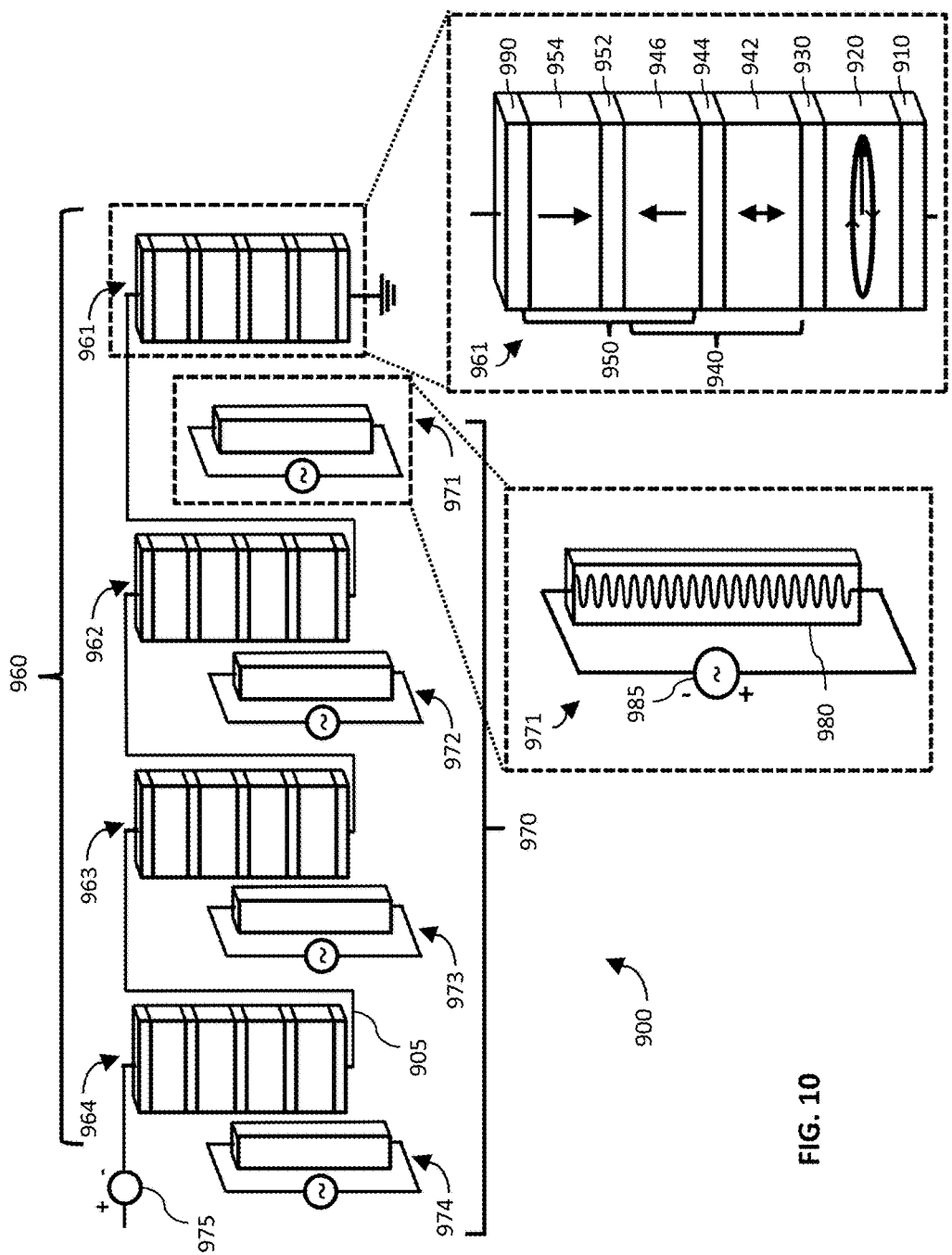
FIG. 10 illustrates an alternative embodiment of magnetic device for an MRAM device utilizing a plurality of OST-MTJ stack and a plurality of external magnetic field generators.

An alternative embodiment of the device shown in FIG. 8 (i.e., a device comprising a plurality of OST-MTJ stacks and a corresponding plurality of magnetic field generators) is depicted in FIG. 10. In this embodiment, magnetic device 900 has had the layers of its OST-MTJ stacks inverted with respect to the embodiment shown in FIG. 8, and the location of the plurality of magnetic field generators has been changed relative to the embodiment shown in FIG. 8. In addition, the conductive 905 wire connects to plurality of OST-MTJ stacks in a different manner than the device in FIG. 8 (i.e., directing current through the layers of the OST-MTJ stacks in the same order for all of the OST-MTJ stacks). Each OST-MTJ includes the same basic features, which will be described with respect to OST-MTJ stack 961, depicted in FIG. 10. In particular, OST-MTJ stack 961 includes a seed layer 910. Inducible precessional magnetic layer 920 is placed over seed layer 910. Inducible precessional magnetic layer 920 has the same properties, construction and characteristics as inducible precessional magnetic layer 750, discussed above. Nonmagnetic spacer 930 is placed over inducible precessional magnetic layer 920. Nonmagnetic spacer 930 has the same properties, construction and characteristics as nonmagnetic spacer 740, discussed above. MTJ 940 is placed over nonmagnetic spacer 930. MTJ 940 is generally constructed of free layer 942 (which is placed over nonmagnetic spacer 930) and reference layer 946. Free layer 942 and reference layer 946 are spatially separated from each other by tunneling barrier layer 944, which is made of an insulating material. MTJ 940 has the same properties, construction and characteristics as MTJ 730, discussed above. Tunneling barrier layer 944 also forms part of synthetic antiferromagnetic (SAF) layer 950. SAF layer 950 is comprised of a first SAF layer 946, which is also the reference layer of OST-MTJ stack 961, anti-ferromagnetic coupling layer 952 and second SAF layer 954. Anti-ferromagnetic coupling layer 952 is placed over first SAF layer 946. Second SAF layer 954 is placed over antiferromagnetic coupling layer 952. Finally, capping layer 990 is placed over SAF layer 950. Other than the ordering of the layers, OST-MTJ stack 961 operates in the same manner as described with respect to the embodiment shown in FIG. 8.

The plurality of magnetic field generators 970 is physically separate from the plurality of OST-MTJ stacks 960. Each magnetic field generator in plurality 970 includes the same basic features, which will be described with respect to magnetic field generator 971, depicted in FIG. 10. External wire 980 is located proximate to free magnetic layer 942 and inducible precessional magnetic layer 920, such that the external alternating magnetic field generated by external wire 980 can interact with free magnetic layer 942 and inducible precessional magnetic layer 920. External wire 980 has the same properties, construction and characteristics as external wire 780, discussed above. A first current comprising an alternating current can be provided by first current source 985. A second current (i.e., a programming current) can be provided by second current source 975. Other than the ordering of the layers and the relative positioning of the plurality of MTJ stacks 960 and the plurality of magnetic field generators 970, magnetic device 900 operates in the same manner as described with respect to the embodiment shown in FIG. 8. Thus, just as shown in FIGS. 6a-6b, inducible precessional magnetic layer 920 can rotate in such a way that spin transfer torque 610 is applied in a beneficial manner throughout the entire precession cycle of free layer 942. In addition, the rotation of inducible precessional magnetic layer 920 is controlled by the external alternating magnetic field generated by external wire 980, such that rotation of inducible precessional magnetic layer 920 only occurs when the magnetization vector of free layer 942 is being switched (i.e., the bit is being written). In addition, each OST-MTJ stack of plurality 960 can be selectively activated by its corresponding magnetic field generator of plurality 970 (i.e., magnetic field generator 971 activates OST-MTJ stack 961 for switching, magnetic field generator 972 activates OST-MTJ stack 962 for switching, etc.).

All of the layers of devices 700, 800 and 900, illustrated in FIGS. 8-10, can be formed by a thin film sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., oxygen, argon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture magnetic devices 700, 800 and 900 are well-known to those skilled in the art and will not be described in detail herein so as not to unnecessarily obscure aspects of the disclosure herein.

It should be appreciated to one skilled in the art that a plurality of magnetic devices 700, 800 and 900 can be manufactured and provided as respective bit cells of an STT-MRAM device. In other words, each MTJ stack can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:
1. A magnetic device comprising:
(1) a plurality of orthogonal spin transfer magnetic tunnel junction (OST-MTJ) stacks comprising a first OST-MTJ stack and a second OST-MTJ stack, the plurality of OST-MTJ stacks connected in series by a conductive wire, the first OST-MTJ stack and the second OST-MTJ stack each comprising
(a) a magnetic tunnel junction (MTJ) in a first plane, the MTJ comprising a reference magnetic layer, a non-magnetic tunnel barrier layer, and a free magnetic layer, the free magnetic layer and the reference magnetic layer separated by the non-magnetic tunnel barrier layer, the reference magnetic layer having a magnetization vector that is perpendicular to the first plane and having a fixed magnetization direction, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions around an axis perpendicular to the first plane, the magnetization vector of the free magnetic layer having a predetermined precession frequency; and

(b) a non-magnetic spacer in a second plane, separating the MTJ from an inducible precessional magnetic layer;
(c) the inducible precessional magnetic layer in a third plane and coupled to the non-magnetic spacer, the inducible precessional magnetic layer having a magnetization vector with a magnetization component in the third plane that freely rotates at an induced rotation frequency upon interaction with an alternating magnetic field and is fixed in the absence of the alternating magnetic field;
(2) a programming current source that directs a programming current through the plurality of OST-MTJ stacks via the conductive wire; and
(3) a plurality of external magnetic field generators comprising a first external magnetic field generator and a second external magnetic field generator, the first external magnetic field generator and the second external magnetic field generator each comprising an external wire and an AC current source that directs an alternating current through the external wire, thereby generating an alternating magnetic field;
wherein the first external magnetic field generator can generate a first alternating magnetic field that interacts with the magnetization vector of the inducible precessional magnetic layer of the first OST-MTJ stack and the second external magnetic field generator can generate a second alternating magnetic field that interacts with the magnetization vector of the inducible precessional magnetic layer of the second OST-MTJ stack;
wherein application of the programming current to the plurality of OST-MTJ stacks produces a first spin-polarized current having spin-polarized electrons in the first OST-MTJ stack, the first spin-polarized electrons exerting a first spin transfer torque on the magnetization vector of the free magnetic layer of the first OST-MTJ stack, the direction of the first spin transfer torque determined in part by the direction of the magnetization vector of the inducible precessional magnetic layer of the first OST-MTJ stack;
wherein the induced rotation frequency of the inducible precessional magnetic layer of the first OST-MTJ stack is synchronized with the predetermined precession frequency of the free magnetic layer of the first OST-MTJ stack when the first alternating magnetic field interacts with the magnetization vector of the inducible precessional magnetic layer of the first OST-MTJ stack, thereby causing the first spin transfer torque to assist switching of the magnetization vector of the free magnetic layer of the first OST-MTJ stack.

2. The magnetic device of claim 1, wherein the plurality of OST-MTJ stacks further comprises a third OST-MTJ stack, the third OST-MTJ stack comprising:
(a) a magnetic tunnel junction (MTJ) in a first plane, the MTJ comprising a reference magnetic layer, a non-magnetic tunnel barrier layer, and a free magnetic layer, the free magnetic layer and the reference magnetic layer separated by the non-magnetic tunnel barrier layer, the reference magnetic layer having a magnetization vector that is perpendicular to the first plane and having a fixed magnetization direction, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions around an axis perpendicular to the first plane, the magnetization vector of the free magnetic layer having a predetermined precession frequency; and
(b) a non-magnetic spacer in a second plane, separating the MTJ from an inducible precessional magnetic layer;
(c) the inducible precessional magnetic layer in a third plane and coupled to the non-magnetic spacer, the inducible precessional magnetic layer having a magnetization vector with a magnetization component in the third plane that freely rotates at an induced rotation frequency upon interaction with an alternating magnetic field and is fixed in the absence of the alternating magnetic field.

3. The magnetic device of claim 2, wherein the plurality of external magnetic field generators further comprises a third external magnetic field generator, the third external magnetic field generator comprising an external wire and an AC current source that directs an alternating current through the external wire, thereby generating an alternating magnetic field, and the third external magnetic field generator can generate a third alternating magnetic field that interacts with the magnetization vector of the inducible precessional magnetic layer of the third OST-MTJ stack.

4. The magnetic device of claim 1, wherein application of the programming current to the plurality of OST-MTJ stacks produces a second spin-polarized current having spin-polarized electrons in the second OST-MTJ stack, the second spin-polarized electrons exerting a second spin transfer torque on the magnetization vector of the free magnetic layer of the second OST-MTJ stack, the direction of the second spin transfer torque determined in part by the direction of the magnetization vector of the inducible precessional magnetic layer of the first OST-MTJ stack;
wherein the induced rotation frequency of the inducible precessional magnetic layer of the second OST-MTJ stack is synchronized with the predetermined precession frequency of the free magnetic layer of the second OST-MTJ stack when the second alternating magnetic field interacts with the magnetization vector of the inducible precessional magnetic layer of the second OST-MTJ stack, thereby causing the second spin transfer torque to assist switching of the magnetization vector of the free magnetic layer of the second OST-MTJ stack.

5. The magnetic device of claim 4, wherein the induced rotation frequency of the inducible precessional magnetic layer of the first OST-MTJ stack has a first frequency value and the induced rotation frequency of the inducible precessional magnetic layer of the second OST-MTJ stack has a second frequency value.

6. The magnetic device of claim 5, wherein the first frequency value is equal to the second frequency value.

7. The magnetic device of claim 5, wherein the first frequency value is different than the second frequency value.

8. The magnetic device of claim 1, wherein the predetermined precession frequency of the free magnetic layer of the first OST-MTJ stack is the same frequency as the predetermined precession frequency of the magnetic layer of the second OST-MTJ stack.

9. The magnetic device of claim 1, wherein the predetermined precession frequency of the free magnetic layer of the first OST-MTJ stack is a different frequency than the predetermined precession frequency of the magnetic layer of the second OST-MTJ stack.

10. The magnetic device of claim 1, wherein a difference in frequency between the induced rotation frequency of the inducible precessional magnetic layer of the first OST-MTJ stack and the predetermined precession frequency of the free magnetic layer of the first OST-MTJ stack is less than twenty percent of the predetermined precession frequency of the free magnetic layer of the first OST-MTJ stack.

11. The magnetic device of claim 1, wherein a difference in frequency between the induced rotation frequency of the inducible precessional magnetic layer of the first OST-MTJ stack and the predetermined precession frequency of the free magnetic layer of the first OST-MTJ stack is less than ten percent of the predetermined precession frequency of the free magnetic layer of the first OST-MTJ stack.

12. The magnetic device of claim 1, wherein a difference in frequency between the induced rotation frequency of the inducible precessional magnetic layer of the first OST-MTJ stack and the predetermined precession frequency of the free magnetic layer of the first OST-MTJ stack is less than five percent of the predetermined precession frequency of the free magnetic layer of the first OST-MTJ stack.

13. The magnetic device of claim 1, wherein a difference in frequency between the induced rotation frequency of the inducible precessional magnetic layer of the first OST-MTJ stack and the predetermined precession frequency of the free magnetic layer of the first OST-MTJ stack is less than two percent of the predetermined precession frequency of the free magnetic layer of the first OST-MTJ stack.

14. The magnetic device of claim 1, wherein the first alternating magnetic field exerts a force on the magnetization vector of the free magnetic layer of the first OST-MTJ stack, thereby assisting in the switching of the magnetization direction of the free magnetic layer.

15. The magnetic device of claim 1, wherein the first alternating magnetic field enhances the precession of the magnetization vector of the free magnetic layer of the first OST-MTJ stack.

16. The magnetic device of claim 1, wherein switching the magnetization direction of the free magnetic layer of the first OST-MTJ stack requires the magnetization vector of the inducible precessional magnetic layer of the first OST-MTJ stack to rotate at the induced rotation frequency.

17. The magnetic device of claim 1, wherein switching the magnetization direction of the free magnetic layer of the first OST-MTJ stack requires generating the first alternating magnetic field.

18. The magnetic device of claim 1, wherein switching the magnetization direction of the free magnetic layer of the second OST-MTJ stack requires generating the second alternating magnetic field.

19. The magnetic device of claim 1, wherein the non-magnetic spacer of the first OST-MTJ stack prevents coupling of the free magnetic layer of the first OST-MTJ stack to the inducible precessional magnetic layer of the first OST-MTJ stack.

20. The magnetic device of claim 1, wherein the free magnetic layer of the first OST-MTJ stack comprises CoFeB, the non-magnetic tunnel barrier layer of the first OST-MTJ stack comprises MgO, and the free magnetic layer of the first OST-MTJ stack comprises CoFeB.

21. The magnetic device of claim 1, wherein a difference in frequency between the induced rotation frequency of the inducible precessional magnetic layer of the first OST-MTJ stack and the predetermined precession frequency of the free magnetic layer of the first OST-MTJ stack is less than two percent of the predetermined precession frequency of the free magnetic layer of the first OST-MTJ stack.

22. A magnetic device comprising:
(1) a plurality of orthogonal spin transfer magnetic tunnel junction (OST-MTJ) stacks comprising a first OST-MTJ stack and a second OST-MTJ stack, the plurality of OST-MTJ stacks connected in series by a conductive wire, the first OST-MTJ stack and the second OST-MTJ stack each comprising
  (a) a magnetic tunnel junction (MTJ) in a first plane, the MTJ comprising a reference magnetic layer, a non-magnetic tunnel barrier layer, and a free magnetic layer, the free magnetic layer and the reference magnetic layer separated by the non-magnetic tunnel barrier layer, the reference magnetic layer having a magnetization vector that is perpendicular to the first plane and having a fixed magnetization direction, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions around an axis perpendicular to the first plane, the magnetization vector of the free magnetic layer having a predetermined precession frequency; and
  (b) a non-magnetic spacer in a second plane, separating the MTJ from an inducible precessional magnetic layer;
  (c) the inducible precessional magnetic layer in a third plane and coupled to the non-magnetic spacer, the inducible precessional magnetic layer having a magnetization vector with a magnetization component in the third plane that freely rotates at an induced rotation frequency upon interaction with an alternating magnetic field and is fixed in the absence of the alternating magnetic field;
(2) a programming current source that directs a programming current through the plurality of OST-MTJ stacks via the conductive wire; and
(3) an external magnetic field generator comprising an external wire and an AC current source that directs alternating current through the external wire, thereby generating one or more alternating magnetic fields;
wherein the external magnetic field generator can generate a first alternating magnetic field that alternates at a first frequency and a second alternating magnetic field that alternates a second frequency;
wherein the first alternating magnetic field interacts with the magnetization vector of the inducible precessional magnetic layer of the first OST-MTJ stack, thereby causing the magnetization vector of the inducible precessional magnetic layer of the first OST-MTJ stack to rotate at a first induced rotation frequency;
wherein application of the programming current to the plurality of OST-MTJ stacks produces a first spin-polarized current having spin-polarized electrons in the first OST-MTJ stack, the spin-polarized electrons exerting a first spin transfer torque on the magnetization vector of the free magnetic layer of the first OST-MTJ stack, the direction of the first spin transfer torque determined in part by the direction of the magnetization vector of the inducible precessional magnetic layer of the first OST-MTJ stack;
wherein the first induced rotation frequency is synchronized with the predetermined precession frequency of the free magnetic layer of the first OST-MTJ stack when the first alternating magnetic field interacts with the magnetization vector of the inducible precessional magnetic layer of the first OST-MTJ stack, thereby causing the first spin transfer torque to assist switching of the magnetization vector of the free magnetic layer of the first OST-MTJ stack.

23. The magnetic device of claim 22, wherein the second alternating magnetic field interacts with the magnetization vector of the inducible precessional magnetic layer of the second OST-MTJ stack, thereby causing the magnetization vector of the inducible precessional magnetic layer of the second OST-MTJ stack to rotate at a first induced rotation frequency;
  wherein application of the programming current to the plurality of OST-MTJ stacks produces a second spin-polarized current having spin-polarized electrons in the second OST-MTJ stack, the spin-polarized electrons exerting a second spin transfer torque on the magnetization vector of the free magnetic layer of the second OST-MTJ stack, the direction of the first spin transfer torque determined in part by the direction of the magnetization vector of the inducible precessional magnetic layer of the first OST-MTJ stack;
  wherein the second induced rotation frequency is synchronized with the predetermined precession frequency of the free magnetic layer of the second OST-MTJ stack when the second alternating magnetic field interacts with the magnetization vector of the inducible precessional magnetic layer of the second OST-MTJ stack, thereby causing the second spin transfer torque to assist switching of the magnetization vector of the free magnetic layer of the second OST-MTJ stack.

24. The magnetic device of claim 23, wherein the first frequency is different than the second frequency and the magnetization vector of the inducible precessional magnetic layer of the second OST-MTJ stack is fixed in the presence of the first alternating magnetic field.

25. The magnetic device of claim 23, wherein the first frequency is different than the second frequency and the magnetization vector of the inducible precessional magnetic layer of the first OST-MTJ stack is fixed in the presence of the second alternating magnetic field.

26. The magnetic device of claim 23, wherein the first induced rotation frequency is different than the second induced rotation frequency and the magnetization vector of the inducible precessional magnetic layer of the second OST-MTJ stack is fixed in the presence of the first alternating magnetic field.

27. The magnetic device of claim 23, wherein the first induced rotation frequency is different than the second induced rotation frequency and the magnetization vector of the inducible precessional magnetic layer of the first OST-MTJ stack is fixed in the presence of the second alternating magnetic field.

28. The magnetic device of claim 23, wherein the predetermined precession frequency of the free magnetic layer of the first OST-MTJ stack is different than the predetermined precession frequency of the free magnetic layer of the second OST-MTJ stack.

29. The magnetic device of claim 28, wherein the difference between the predetermined precession frequency of the free magnetic layer of the first OST-MTJ stack and the predetermined precession frequency of the free magnetic layer of the second OST-MTJ stack is less than forty percent of the predetermined precession frequency of the free magnetic layer of the first OST-MTJ stack.

30. The magnetic device of claim 28, wherein the difference between the predetermined precession frequency of the free magnetic layer of the first OST-MTJ stack and the predetermined precession frequency of the free magnetic layer of the second OST-MTJ stack is less than twenty percent of the predetermined precession frequency of the free magnetic layer of the first OST-MTJ stack.

31. The magnetic device of claim 28, wherein the difference between the predetermined precession frequency of the free magnetic layer of the first OST-MTJ stack and the predetermined precession frequency of the free magnetic layer of the second OST-MTJ stack is less than thirty percent of the predetermined precession frequency of the free magnetic layer of the first OST-MTJ stack.

32. The magnetic device of claim 23, wherein the plurality of OST-MTJ stacks further comprises a third OST-MTJ stack, the third OST-MTJ stack comprising
  (a) a magnetic tunnel junction (MTJ) in a first plane, the MTJ comprising a reference magnetic layer, a non-magnetic tunnel barrier layer, and a free magnetic layer, the free magnetic layer and the reference magnetic layer separated by the non-magnetic tunnel barrier layer, the reference magnetic layer having a magnetization vector that is perpendicular to the first plane and having a fixed magnetization direction, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions around an axis perpendicular to the first plane, the magnetization vector of the free magnetic layer having a predetermined precession frequency; and
  (b) a non-magnetic spacer in a second plane, separating the MTJ from an inducible precessional magnetic layer;
  (c) the inducible precessional magnetic layer in a third plane and coupled to the non-magnetic spacer, the inducible precessional magnetic layer having a magnetization vector with a magnetization component in the third plane that freely rotates at an induced rotation frequency upon interaction with an alternating magnetic field and is fixed in the absence of the alternating magnetic field.

33. The magnetic device of claim 23, wherein the external magnetic field generator can generate a third alternating magnetic field that alternates at a third frequency;
  wherein the third alternating magnetic field interacts with the magnetization vector of the inducible precessional magnetic layer of the third OST-MTJ stack, thereby causing the magnetization vector of the inducible precessional magnetic layer of the third OST-MTJ stack to rotate at a third induced rotation frequency;
  wherein application of the programming current to the plurality of OST-MTJ stacks produces a third spin-polarized current having spin-polarized electrons in the third OST-MTJ stack, the spin-polarized electrons exerting a third spin transfer torque on the magnetization vector of the free magnetic layer of the third OST-MTJ stack, the direction of the first spin transfer torque determined in part by the direction of the magnetization vector of the inducible precessional magnetic layer of the first OST-MTJ stack;
  wherein the third induced rotation frequency is synchronized with the predetermined precession frequency of the free magnetic layer of the third OST-MTJ stack when the third alternating magnetic field interacts with the magnetization vector of the inducible precessional magnetic layer of the third OST-MTJ stack, thereby causing the third spin transfer torque to assist switching of the magnetization vector of the free magnetic layer of the second OST-MTJ stack.

34. The magnetic device of claim 33, wherein the first induced rotation frequency is different than the third induced rotation frequency and the magnetization vector of the inducible precessional magnetic layer of the first OST-MTJ stack is fixed in the presence of the third alternating magnetic field.

35. The magnetic device of claim 33, wherein switching the magnetization direction of the free magnetic layer of the third OST-MTJ stack requires generating the third alternating magnetic field.

36. The magnetic device of claim 23, wherein switching the magnetization direction of the free magnetic layer of the second OST-MTJ stack requires generating the second alternating magnetic field.

37. The magnetic device of claim 22, wherein a difference in frequency between the induced rotation frequency of the inducible precessional magnetic layer of the first OST-MTJ stack and the predetermined precession frequency of the free magnetic layer of the first OST-MTJ stack is less than twenty percent of the predetermined precession frequency of the free magnetic layer of the first OST-MTJ stack.

38. The magnetic device of claim 22, wherein a difference in frequency between the induced rotation frequency of the inducible precessional magnetic layer of the first OST-MTJ stack and the predetermined precession frequency of the free magnetic layer of the first OST-MTJ stack is less than ten percent of the predetermined precession frequency of the free magnetic layer of the first OST-MTJ stack.

39. The magnetic device of claim 22, wherein a difference in frequency between the induced rotation frequency of the inducible precessional magnetic layer of the first OST-MTJ stack and the predetermined precession frequency of the free magnetic layer of the first OST-MTJ stack is less than five percent of the predetermined precession frequency of the free magnetic layer of the first OST-MTJ stack.

40. The magnetic device of claim 22, wherein the first alternating magnetic field enhances the precession of the magnetization vector of the free magnetic layer of the first OST-MTJ stack.

41. The magnetic device of claim 22, wherein switching the magnetization direction of the free magnetic layer of the first OST-MTJ stack requires generating the first alternating magnetic field.

* * * * *